United States Patent
Tan et al.

[11] Patent Number: 6,136,504
[45] Date of Patent: Oct. 24, 2000

[54] POSITIVE-WORKING PHOTORESIST COMPOSITION

[75] Inventors: Shiro Tan; Toru Fujimori; Toshiaki Aoai, all of Shizuoka, Japan

[73] Assignee: Fuji Photo Film Co., Ltd., Kanagawa, Japan

[21] Appl. No.: 09/280,679

[22] Filed: Mar. 29, 1999

[30] Foreign Application Priority Data

Mar. 30, 1998 [JP] Japan .................................. 10-84164

[51] Int. Cl.[7] .................................................. G03F 7/004
[52] U.S. Cl. ........................ 430/270.1; 430/905; 430/910
[58] Field of Search ................................ 430/270.1, 905, 430/910

[56] References Cited

U.S. PATENT DOCUMENTS 5,942,367  8/1999  Watanabe et al. ..................... 430/170
6,027,854  2/2000  Nishi et al. .......................... 430/270.1

*Primary Examiner*—John S. Chu
*Attorney, Agent, or Firm*—Sughrue, Mion, Zinn, Macpeak & Seas, PLLC

[57] ABSTRACT

The present invention provides an excellent chemically-sensitized positive-working photoresist composition which exhibits a high resolution and a good dimensional stability with time, generates no development residue (scum) and standing waves and is less liable to loss of lone pattern. A novel positive-working photoresist composition is provided comprising at least (a) a copolymer A having at least structural units represented by the following general formulae (I), (II) and (III), (b) a compound which generates an acid when irradiated with actinic rays or radiation and (c) a solvent:

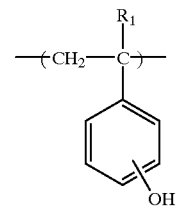

(I)

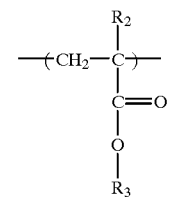

(II)

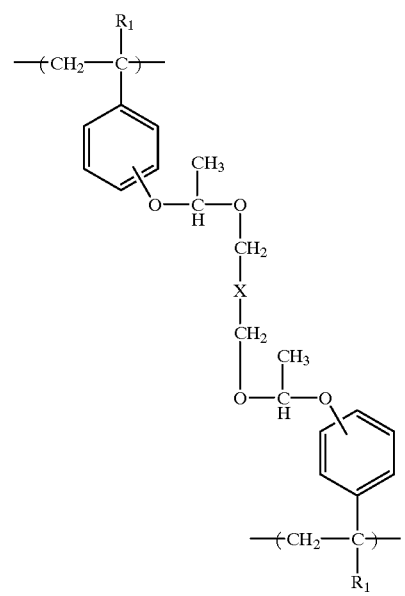

(III)

wherein $R_1$ and $R_2$ each independently represent a hydrogen atom or methyl group; $R_3$ represents a tertiary alkyl or cycloalkyl group which may be substituted; and X represents a divalent organic residue.

6 Claims, No Drawings

POSITIVE-WORKING PHOTORESIST COMPOSITION

FIELD OF THE INVENTION

The present invention relates to a positive-working photoresist composition for use in the production of semiconductor integrated circuit elements, masks for integrated circuit, print circuit boards, liquid crystal panels, etc.

BACKGROUND OF THE INVENTION

Examples of the positive-working photoresist composition include chemically-sensitized resist compositions described in U.S. Pat. No. 4,491,628, and EP 29,139. The chemically-sensitized positive-working resist composition is a pattern-forming material which, when irradiated with radiation such as far ultraviolet rays, allows the exposed area to generate an acid in the presence of which it then undergoes reaction to change the solubility of the area irradiated with actinic radiation and the other area in a developer so that a pattern is formed on a substrate.

Examples of these pattern-forming materials include a combination of a compound which undergoes photodecomposition to generate an acid with acetal or O, N-acetal compound (JP-A-48-89003 (The term "JP-A" as used herein means an "unexamined published Japanese patent application")), a combination of a compound which undergoes photodecomposition to generate an acid with orthoester or amide acetal compound (JP-A-51-120714), a combination of a compound which undergoes photodecomposition to generate an acid with a polymer having acetal or ketal in its main chain (JP-A-53-133429), a combination of a compound which undergoes photodecomposition to generate an acid with an enol ether compound (JP-A-55-12995), a combination of a compound which undergoes photodecomposition to generate an acid with an N-acyliminocarbonate compound (JP-A-55-126236), a combination of a compound which undergoes photodecomposition to generate an acid with a polymer having an orthoester group in its main chain (JP-A-56-17345), a combination of a compound which undergoes photodecomposition to generate an acid with a tertiary alkyl ester compound (JP-A-60-3625), a combination of a compound which undergoes photodecomposition to generate an acid with a silyl ester compound (JP-A-60-10247), and a combination of a compound which undergoes photodecomposition to generate an acid with a silyl ether compound (JP-A-60-37549, JP-A-60-121446). These compounds each exhibit a quantum yield of more than 1 in principle and thus show a high photosensitivity.

As a system which normally stays stable with time but undergoes decomposition to become alkali-soluble when heated in the presence of an acid there may be used a combination of a compound which generates an acid when exposed to light described in JP-A-59-45439, JP-A-60-3625, JP-A-62-229242, JP-A-63-27829, JP-A-63-36240, JP-A-63-250642, Poly. Eng. Sci., vol. 23, p. 12 (1983), ACS. Sym. vol. 242, p. 11 (1984), Semiconductor World Nov. 1987, p. 91, Macromolecules, vol. 21. p. 1475 (1988), SPIE, vol. 920, p. 42 (1988), etc. with a tertiary or secondary carbon (e.g., t-butyl, 2-cyclohexenyl) ester or carbonic ester compound. Such a system, too, has a high sensitivity and shows little absorption in far ultraviolet range. Thus, this system can be a system suitable for the reduction of wavelength of light from light source enabling ultrafine working.

JP-A-2-19847 discloses a photoresist composition containing a resin having phenolic hydroxyl groups in poly(p-hydroxystyrene) entirely or partially protected by tetrahydropyranyl group.

Similarly, JP-A-4-219757 discloses a photoresist composition containing a resin having phenolic hydroxyl groups in poly(p-hydroxystyrene) substituted by acetal group in a proportion of from 20 to 70%.

Further, JP-A-5-249682 discloses a similar photoresist composition comprising an acetal-protected resin.

Moreover, JP-A-8-123032 discloses a photoresist composition comprising a ternary copolymer containing groups protected by acetal group.

Further, JP-A-5-113667, JP-A-6-266112, JP-A-6-289608, and JP-A-7-209868 disclose a photoresist composition comprising hydroxystyrene and (meth)acrylate copolymer.

However, these resist compositions exhibit a drastic dimensional change in resist pattern with time between exposure and post bake (post exposure delay time; hereinafter referred to as "PED") and leave something to be desired in resolution.

Further, JP-A-8-253534 discloses a photoresist composition comprising a partially crosslinked polymer containing group substituted by acetal group. JP-A-8-305025 discloses a radiation-sensitive composition comprising a polymer containing a specific acid-cleavable acetal group in polymer main chain or as a crosslinking member between two or more polymer chains. JP-A-10-31310 discloses a radiation-sensitive composition comprising a copolymer having specific repeating units (1) and (2) and a branched chain unit.

However, these photoresist compositions comprise a hydroxystyrene skeleton and thus are disadvantageous in that they exhibit a deteriorated adhesivity to substrate and the resulting lone pattern can be peeled off the substrate during development (hereinafter referred to as "loss of lone pattern"). Thus, these photoresist compositions leave something to be desired.

SUMMARY OF THE INVENTION

It is therefore an object of the present invention to provide a positive-working photoresist composition which exhibits a high resolution and is insusceptible to loss of lone pattern.

It is another object of the present invention to provide an excellent chemically-sensitized positive-working photoresist composition which generates no standing waves.

It is a further object of the present invention to provide an excellent chemically-sensitized positive-working photoresist composition which generates no development residue (scum) and exhibits a good dimensional stability with time.

These and other objects of the present invention will become more apparent from the following detailed description and examples.

The inventors made extensive studies of solution to these problems. As a result, it was found that the use of a positive-working photoresist composition comprising a resin having at least three specific structural units, a compound which generates an acid when irradiated with actinic rays or radiation and a solvent can provide a high resolution and prevent the loss of lone pattern. The present invention has thus been worked out.

The positive-working photoresist composition according to the present invention has the following constitutions:

(1) A positive-working photoresist composition comprising at least (a) a copolymer A having at least structural units represented by the following general formulae (I), (II) and (III), (b) a compound which generates an acid when irradiated with actinic rays or radiation and (c) a solvent:

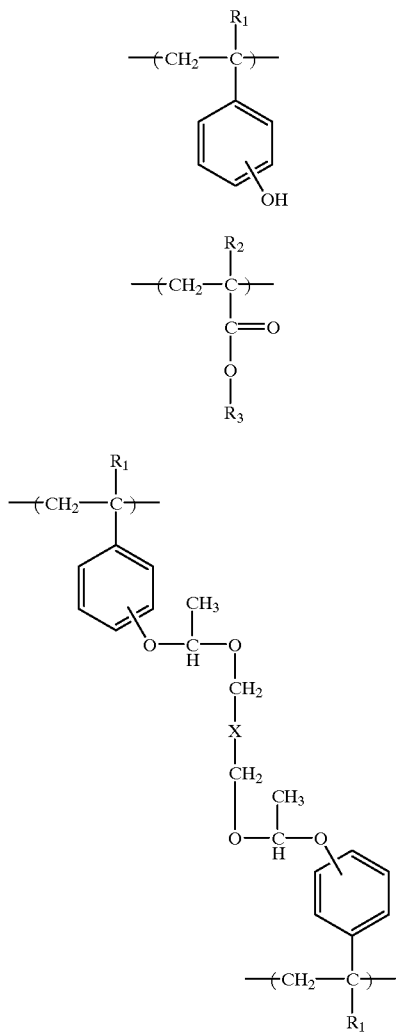

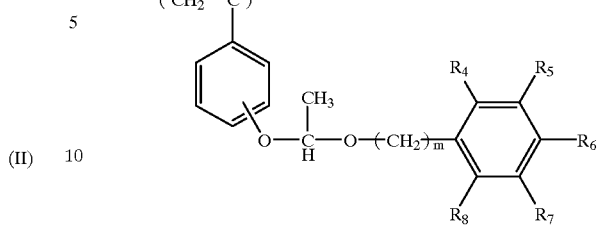

wherein $R_1$ and $R_2$ each independently represent a hydrogen atom or methyl group; $R_3$ represents a tertiary alkyl group or a tertiary cycloalkyl group which may be substituted; and X represents a divalent organic residue.

(2) The positive-working photoresist composition according to Clause (1), wherein said copolymer A as the component (a) further contains a structural unit represented by the following general formula (IV):

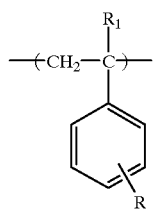

wherein $R_1$ is the same as defined in Clause 1; and R represents a hydrogen atom or $C_{1-4}$ straight-chain or branched alkyl, methoxy or acetoxy group.

(3) The positive-working photoresist composition according to Clause (1) or (2), wherein said copolymer A as the component (a) further contains a structural unit represented by the following general formula (V):

wherein $R_1$ is the same as defined in Clause 1; $R_4$ to $R_8$ each independently represent a hydrogen atom, hydroxyl group, $C_{1-8}$ straight-chain, branched or cyclic alkyl group, $C_{1-4}$ alkoxy group or halogen atom; and m represents an integer of from 1 to 6.

(4) The positive-working photoresist composition according to Clause (1), wherein said copolymer A as the component (a) is obtained by the reaction of a copolymer having the structural units represented by the general formulae (I) and (II) with a divinyl ether compound represented by the following general formula (VI):

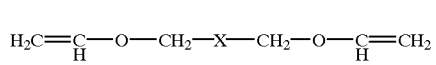

wherein X is the same as defined in Clause 1.

(5) The positive-working photoresist composition according to Clause (4), wherein X in the foregoing general formula (VI) is a group selected from the group consisting of the following divalent organic residues:

(6) The positive-working photoresist composition according to any one of Clause (1) to (5), wherein said compound (b) which generates an acid when irradiated with actinic rays or radiation contains at least one sulfonium salt represented by the following general formula (VII): [ka-12]

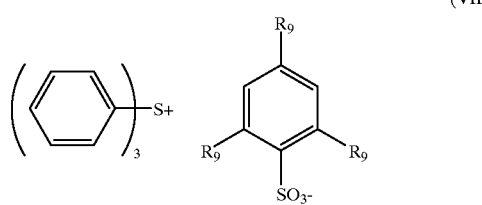

wherein $R_9$'s each independently represent a hydrogen atom or $C_{3-16}$ branched alkyl group, with the proviso that at least one of $R_9$'s is not a hydrogen atom.

DETAILED DESCRIPTION OF THE INVENTION

The present invention will be further described hereinafter.

[a] Copolymer having at least structural units represented by the foregoing general formulae (I) to (III)

The copolymer A to be incorporated in the positive-working photoresist composition of the present invention contains as structural units a structural unit represented by the foregoing general formula (I) (hereinafter referred to as "structural unit (I)"), a structural unit represented by the foregoing general formula (II) (hereinafter referred to as "structural unit (II)") and a crosslinking unit represented by the foregoing general formula (III) (hereinafter referred to as "structural unit (III)"). Referring to preferred content of the various structural units in the copolymer A, the content of the structural unit (I) is from 40 to 90 mol %, preferably from 50 to 80 mol %, more preferably from 50 to 70 mol %.

The content of the structural unit (II) in the copolymer A is from 5 to 50 mol %, preferably from 10 to 45 mol %, more preferably from 10 to 40 mol %.

The content of the structural unit (III) in the copolymer A is from 0.2 to 10 mol %, preferably from 0.5 to 7 mol %, more preferably from 1 to 5 mol %.

The copolymer A to be used in the present invention may further comprises a structural unit represented by the general formula (IV) in addition to those represented by the foregoing general formulae (I) to (III). Referring to preferred content of the various structural units, the content of the structural unit (I) is from 40 to 80 mol %, preferably from 50 to 80 mol %, more preferably from 50 to 70 mol %. The content of the structural unit (II) is from 5 to 50 mol %, preferably from 10 to 45 mol %, more preferably from 10 to 40 mol %. The content of the structural unit (III) is from 0.2 to 10 mol %, preferably from 0.5 to 7 mol %, more preferably from 1 to 5 mol %. The content of the structural unit (IV) is from 5 to 40 mol %, preferably from 5 to 30 mol %, more preferably from 5 to 20 mol %.

The incorporation of the structural unit (IV) in the copolymer A is effective for the further enhancement of resolution.

The copolymer A to be used in the present invention may further contain a structural unit represented by the general formula (V) in addition to those represented by the foregoing general formulae (I) to (III).

Referring to preferred content of the various structural units, the content of the structural unit (I) is from 40 to 80 mol %, preferably from 50 to 80 mol %, more preferably from 50 to 70 mol %. The content of the structural unit (II) is from 5 to 50 mol %, preferably from 10 to 45 mol %, more preferably from 10 to 40 mol %. The content of the structural unit (III) is from 0.2 to 10 mol %, preferably from 0.5 to 7 mol %, more preferably from 1 to 5 mol %. The content of the structural unit (V) is from 5 to 40 mol %, preferably from 5 to 30 mol %, more preferably from 5 to 20 mol %.

The incorporation of the structural unit (V) in the copolymer A is effective for the prevention of generation of standing wave.

The copolymer A to be used in the present invention may further contain a structural unit represented by the general formula (V) in addition to those represented by the foregoing general formulae (I) to (IV).

Referring to preferred content of the various structural units, the content of the structural unit (I) is from 40 to 80 mol %, preferably from 50 to 80 mol %, more preferably from 50 to 70 mol %. The content of the structural unit (II) is from 5 to 49 mol %, preferably from 10 to 45 mol %, more preferably from 10 to 40 mol %. The content of the structural unit (III) is from 0.2 to 10 mol %, preferably from 0.5 to 7 mol %, more preferably from 1 to 5 mol %. The content of the structural unit (IV) is from 5 to 40 mol %, preferably from 5 to 30 mol %, more preferably from 5 to 20 mol %. The content of the structural unit (V) is from 5 to 40 mol %, preferably from 5 to 30 mol %, more preferably from 5 to 20 mol %.

In the general formula (I), $R_1$ represents a hydrogen atom or methyl group, preferably a hydrogen atom.

In the general formula (II), $R_2$ represents a hydrogen atom or methyl group. $R_3$ represents a tertiary alkyl group or a tertiary cycloalkyl group which may be substituted. Examples of the tertiary alkyl or cycloalkyl group which may be substituted include t-butyl group, t-amyl group, t-(triethyl)methyl group, 1-methyl-1-cylohexyl group, and 1-ethyl cyclopentyl group. Preferred among these compounds are t-butyl group, t-amyl group, and 1-methyl-1-cylohexyl group. Particularly preferred among these compounds is t-butyl group.

In the general formula (III), $R_1$ represents a hydrogen atom or methyl group, preferably a hydrogen atom.

X represents a divalent organic residue. Examples of the divalent organic residue include $C_{2-16}$ hydrocarbon groups which may be substituted. Preferred examples of these $C_{2-16}$ hydrocarbon groups which may be substituted include $C_{2-16}$ alkylene group which maybe substituted, and $C_{6-16}$ arylene group which maybe substituted. Examples of the alkylene group include ethylene group, propylene group, butylene group, isobutylene group, heptylene group, hexylene group, and cyclohexylene group. Examples of the arylene group include phenylene group, and naphthylene group.

Preferred examples of the divalent organic residue represented by X include cyclohexylene, and phenylene. Examples of these groups include 1, 4-cyclohexylene, and 1, 4-phenylene. Preferred examples of substituents on these groups include alkyl group, halogen, hydroxyl group, amino group, and alkoxy group.

The copolymer A contains the compounds represented by the foregoing general formulae (I) to (III) as essential components. The copolymer A preferably further contains a structural unit represented by the general formula (IV).

In the general formula (IV), $R_1$ represents a hydrogen atom or methyl group, preferably a hydrogen atom. R preferably represents a hydrogen atom, $C_{1-4}$ straight-chain or branched alkyl, methoxy or acetoxy group, more preferably a hydrogen atom, t-butyl group, methoxy group or acetoxy group, particularly a hydrogen atom, t-butyl group or acetoxy group. Specific preferred examples of $C_{1-4}$ straight-chain or branched alkyl group include methyl group, ethyl group, n-propyl group, isopropyl group, n-butyl group, sec-butyl group, and t-butyl group.

The copolymer A contains the compounds represented by the foregoing general formulae (I) to (III) as essential components. The copolymer A preferably further contains a structural unit represented by the general formula (V).

In the general formula (V), $R_1$ represents a hydrogen atom or methyl group, preferably a hydrogen atom.

$R_4$ to $R_8$ each independently represent a hydrogen atom, hydroxyl group, $C_{1-8}$ straight-chain, branched or cyclic alkyl group, $C_{1-4}$ alkoxy group or halogen atom.

Preferred examples of the $C_{1-8}$ straight-chain or branched alkyl group include methyl group, ethyl group, n-propyl group, iso-propyl group, n-butyl group, sec-butyl group, t-butyl group, pentyl group, hexyl group, and octyl group. Particularly preferred among these compounds are methyl group, ethyl group, iso-propyl group, and t-butyl group. Preferred examples of the $C_{1-8}$ cyclic alkyl group include cyclopropyl group, cyclopentyl group, and cyclohexyl group. Particularly preferred among these $C_{1-8}$ cyclic alkyl groups is cyclohexyl group. Preferred examples of the $C_{1-4}$ alkoxy group include methoxy group, ethoxy group, propoxy group, and butoxy group. Particularly preferred among these $C_{1-4}$ alkoxy groups are methoxy group and t-butoxy group. Preferred examples of the halogen atom include fluorine atom, chlorine atom, bromine atom, and iodine atom. Particularly preferred among these halogen atoms is chlorine atom. $R_4$ to $R_8$ each independently represent the foregoing substituent. Preferably, all of $R_4$ to $R_8$ are hydrogen atoms. Otherwise, one of $R_4$ to $R_8$ is preferably the foregoing alkyl group. In the general formula (V), m represents an integer of from 1 to 6, preferably from 2 to 4, more preferably 2.

The copolymer A contains the compounds represented by the foregoing general formulae (I) to (III) as essential components. The copolymer A preferably further contains structural units represented by the general formulae (IV) and (V) at the same time.

The incorporation of the structural unit (III) in the copolymer A can be accomplished by the acetal exchange reaction of a copolymer having structural units (I) and (II), a monofunctional vinyl ether compound and a corresponding diol compound in the presence e of an acid catalyst. Alternatively, it can be accomplished by the reaction of a copolymer having structural units (I) and (II) with a bifunctional divinyl ether compound.

In accordance with the foregoing method by acetal exchange reaction, the percent incorporation of the structure represented by the general formula (III) cannot be stabilized, making it difficult to stably produce the desired compound. Therefore, the method using a divinyl ether compound is preferred.

As the divinyl ether compound employable herein there is preferably used a divinyl ether compound represented by the general formula (VI). X represents a divalent organic residue. Examples of the divalent organic residue include those defined above.

The crosslinking with the divinyl ether of the present invention advantageously inhibits the decomposition of acetal group to a proper extent, making it possible to inhibit the change of viscosity and sensitivity of resist with time and the generation of scum (development residue).

The weight-average molecular weight of the copolymer A can be determined by gel permeation chromatography as calculated in terms of polystyrene (Mw). The weight-average molecular weight of the copolymer A is preferably from 2,000 to 1,000,000, more preferably from 4,000 to 500,000, particularly from 8,000 to 100,000. If the weight-average molecular weight of the copolymer A falls below 2,000, the resulting resist is liable to drastic reduction of thickness. On the contrary, if the weight-average molecular weight of the copolymer A exceeds 1,000,000, the copolymer tends to exhibit a deteriorated solubility, lowering the resolution.

Specific examples of the structure of the copolymer A will be given below, but the present invention should not be construed as being limited thereto. In the following specific examples, Me represents a methyl group, Et represents an ethyl group, Ph represents a phenyl group, tBu represents a t-butyl group, and Ac represents an acetyl group.

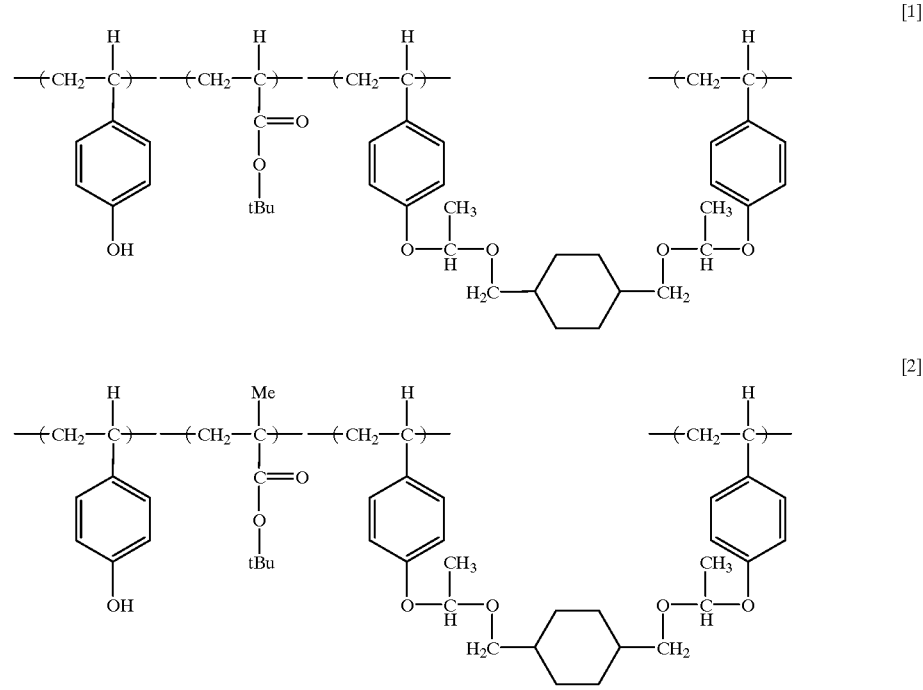

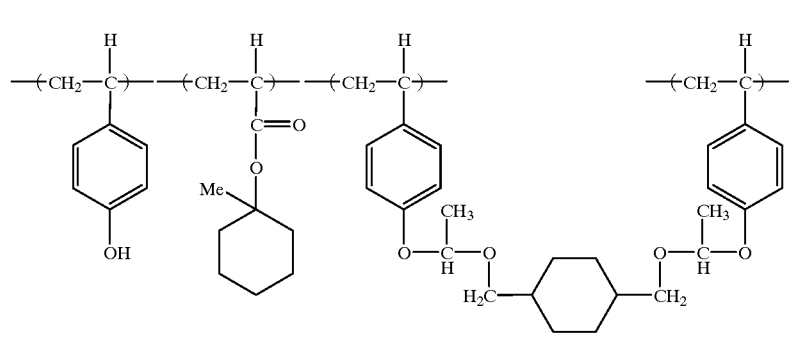
[3]
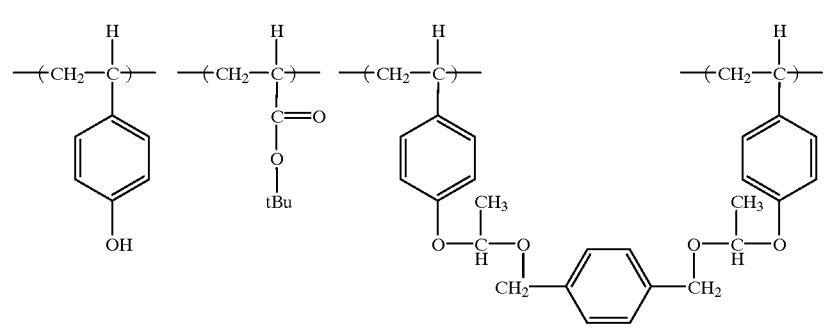
[4]
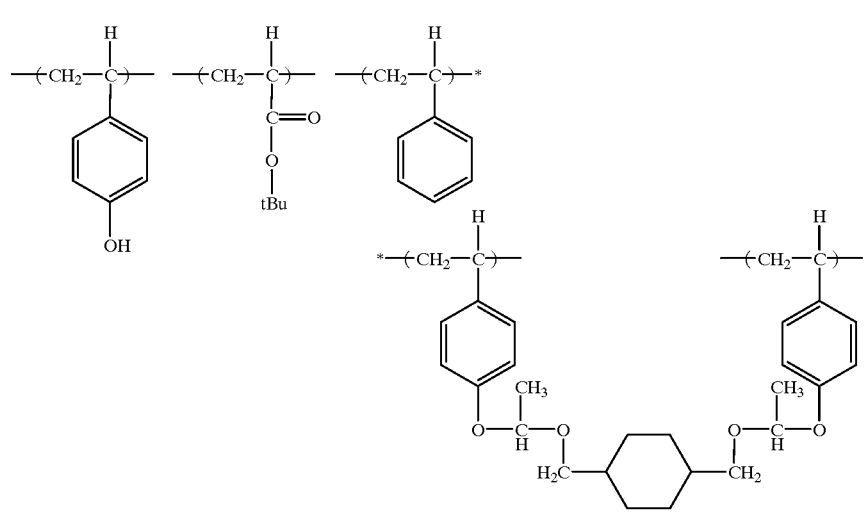
[5]

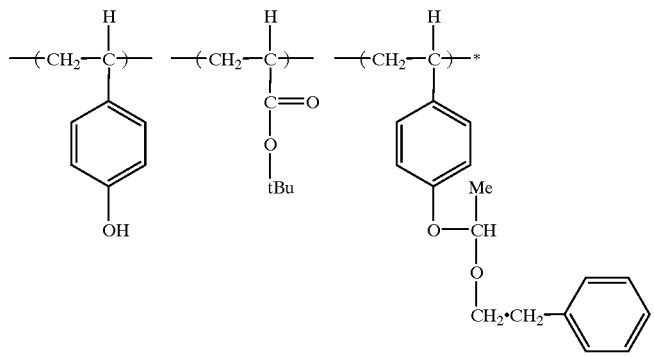
[6]
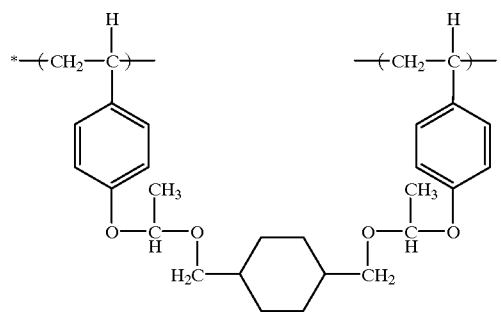
[7]
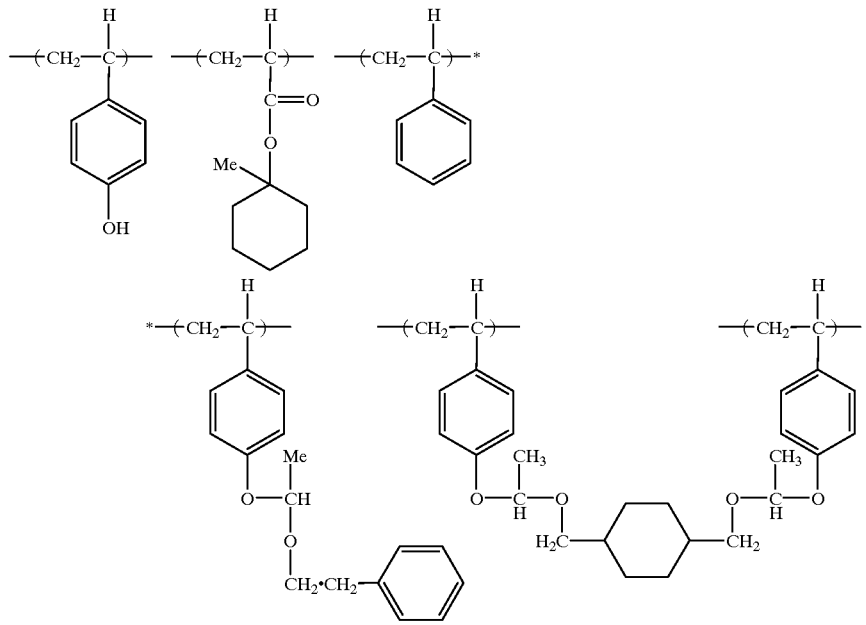

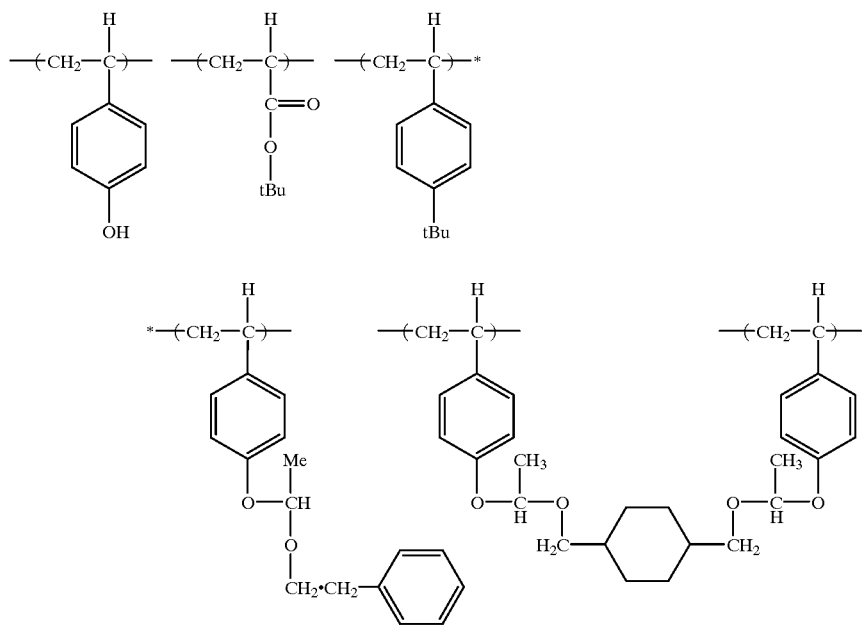
[8]
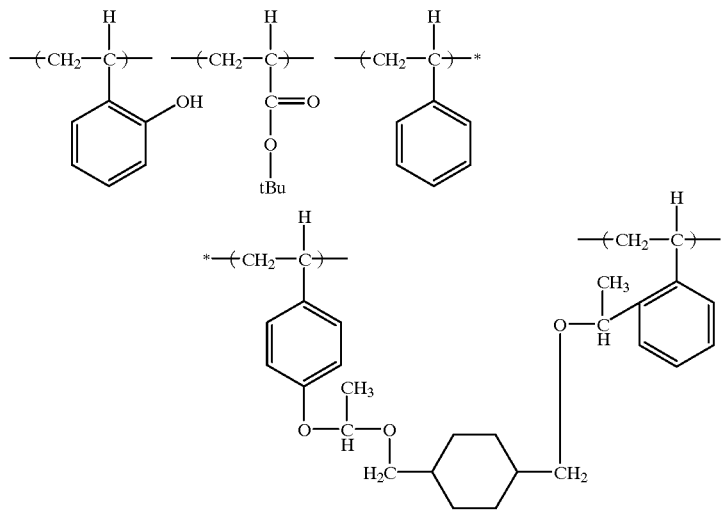
[9]

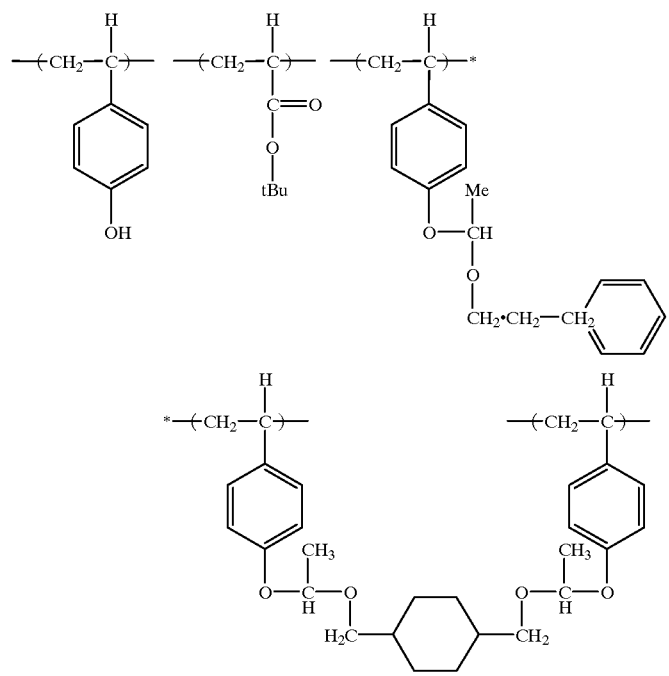
[10]
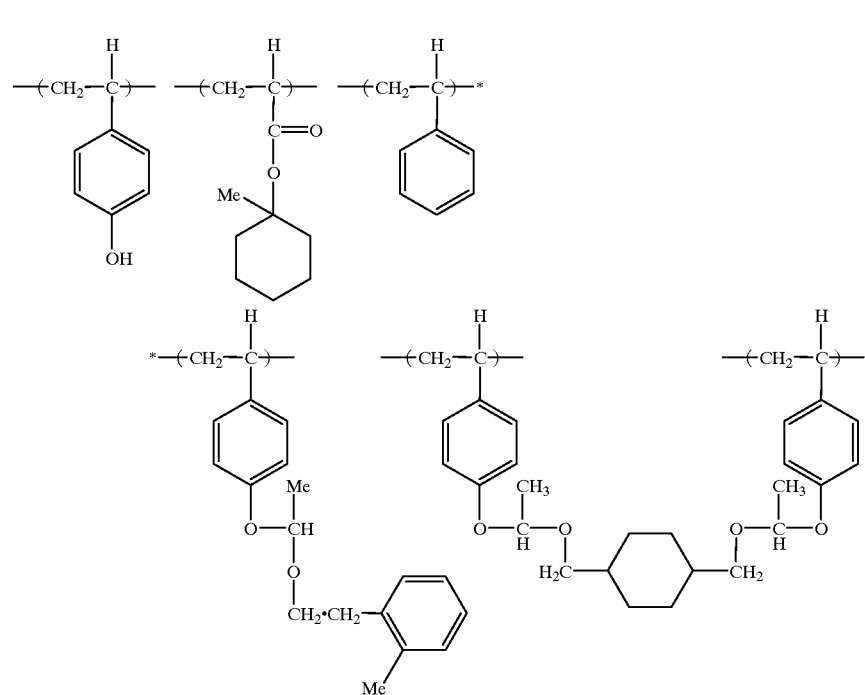
[11]

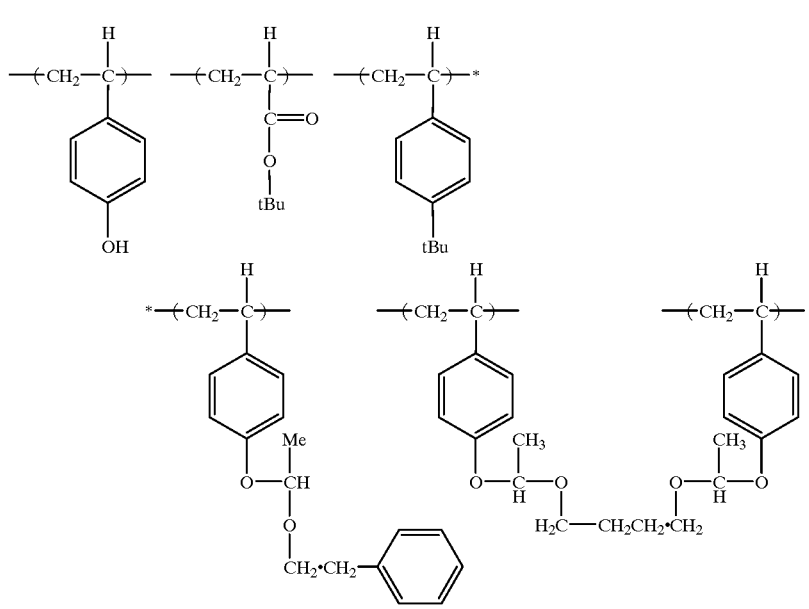
[12]
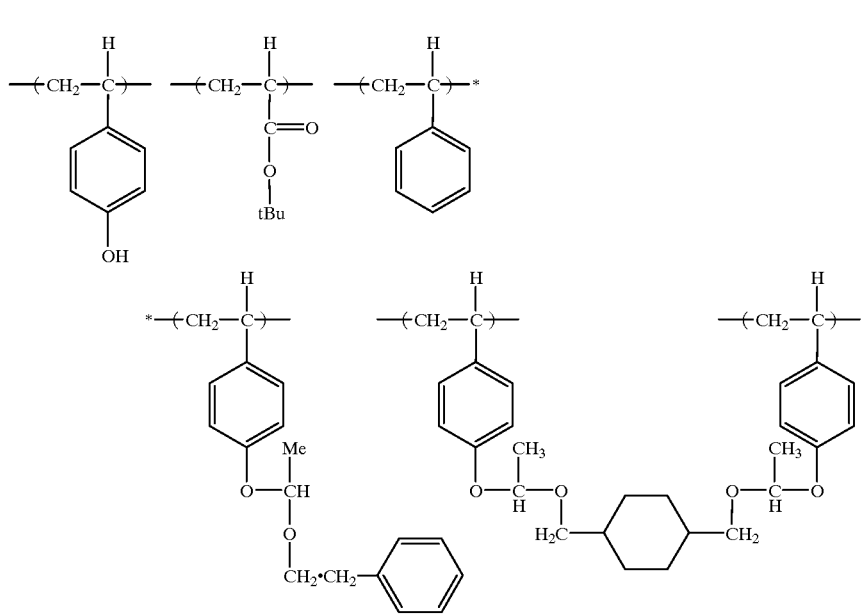
[13]

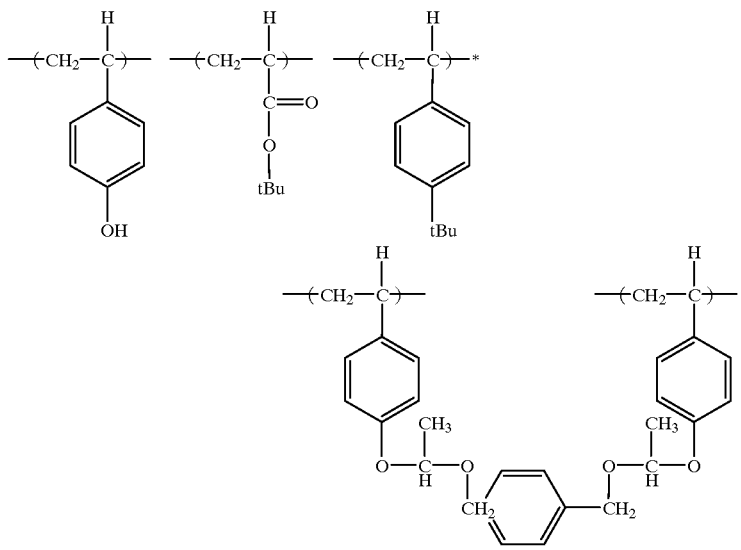

[14]

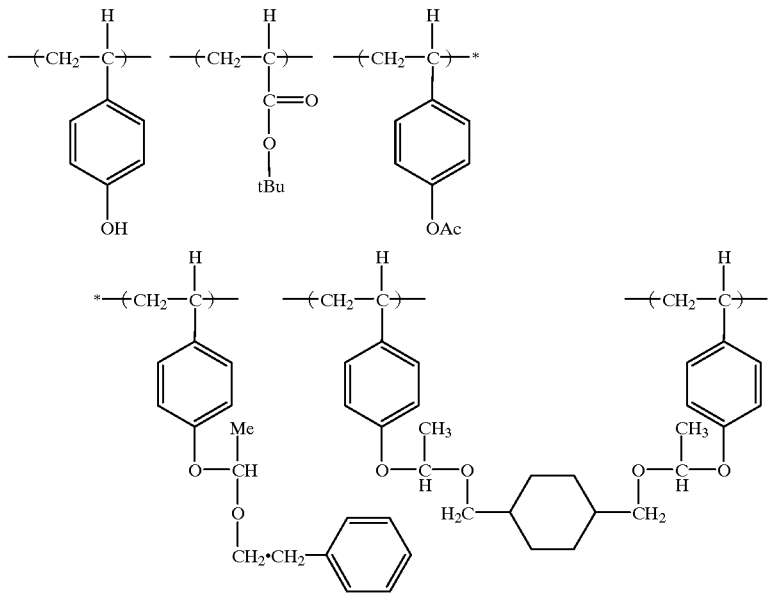

[15]

The composition of the present invention may comprise an alkali-soluble resin free of acid-decomposable group incorporated therein to exhibit an enhanced sensitivity. The foregoing alkali-soluble resin free of acid-decomposable group (hereinafter simply referred to as "alkali-soluble resin") is a resin soluble in an alkali. Preferred examples of such a resin include polyhydroxystyrene, novolak resin, and derivatives thereof. Further, copolymer resins containing p-hydroxystyrene unit may be used so far as they are soluble in an alkali. In particular, poly(p-hydroxystyrene), poly(p/m-hydroxystyrene) copolymer, poly-(p/o-hydroxystyrene) copolymer, and poly(p-hydroxystyrene-styrene) copolymer are preferably used. Further, poly(alkyl-substituted hydroxystyrene) resins such as poly(4-hydroxy-3-methylstyrene) resin and poly(4-hydroxy-3,5-dimethylstyrene) resin and resins obtained by alkylating or acetylating some of phenolic hydroxyl groups in these resins are preferably used so far as they are soluble in an alkali.

If some (not greater than 30 mol %) of phenol nuclei in these resins have been hydrogenated, these resins exhibit an enhanced transparency and thus are advantageous in sensitivity, resolution and formation of rectangular profile.

Examples of the alkali-soluble resin to be used in the present invention include novolak resins, hydrogenated novolak resins, acetone-pyrogallol resins, polyhydroxystyrene, alkyl-substituted polyhydroxystyrene, poly(hydroxystyrene-N-substituted maleimide) copolymer, partial O-alkylation or O-acylation product of polyhydroxystyrene, poly(styrene-maleic anhydride) copolymer, carboxyl group-containing methacrylic resin, derivatives thereof, poly(styrene-hydroxystyrene) copolymer, and hydrogenated polyhydroxystyrene. However, the present invention is not limited to these resins.

Particularly preferred examples of the alkali-soluble resin to be used in the present invention include novolak resins, alkali-soluble resins containing p-hydroxystyrene unit (preferablypoly(alkyl-substitutedhydroxystyrene) resin such as poly(p-hydroxystyrene) copolymer, poly(p/m-hydroxystyrene) copolymer, poly(p/o-hydroxystyrene)

copolymer, poly(p-hydroxystyrene-styrene) copolymer, poly(4-hydroxy-3-methylstyrene) resin and poly(4-hydroxy-3,5-dimethylstyrene) resin, resins obtained by alkylating or acetylating some of phenolic hydroxyl groups in these resins, partially hydrogenated polyhydroxystyrene resins, polyhydroxystyrene resins, partially hydrogenated novolak resins, and partially hydrogenated polyhydroxystyrene resins.

The term "polyhydroxystyrene" as used herein is meant to indicate a polymer obtained by the polymerization of at least one monomer selected from the group consisting of p-hydroxystyrene monomer, m-hydroxystyrene monomer, o-hydroxystyrene monomer and hydroxystyrene monomer obtained by substituting these monomers by $C_{1-4}$ alkyl at the position ortho to the position at which hydroxyl group is connected thereto.

The foregoing novolak resin can be obtained by the addition condensation of a predetermined monomer as a main component with aldehydes in the presence of an acid catalyst.

Examples of the predetermined monomer include cresols such as phenol, m-cresol, p-cresol and o-cresol, xylenols such as 2, 5-xylenol, 3, 5-xylenol, 3, 4-xylenol and 2, 3-xylenol, alkylphenols such as m-ethylphenol, p-ethylphenol, o-ethylphenol, p-t-butylphenol, p-octylphenol and 2, 3, 5-trimethylphenol, alkoxyphenols such as p-methoxyphenol, m-methoxyphenol, 3, 5-dimethoxyphenol, 2-methoxy-4-methylphenol, m-ethoxyphenol, p-ethoxyphenol, m-propoxyphenol, p-propoxyphenol, m-butoxyphenol and p-butoxyphenol, bisalkylphenols such as 2-methyl-4-isopropylphenol, and hydroxyaromatic compounds such as dihydroxybiphenyl, bisphenol A, phenylphenol, resorcinol and naphthol. These monomers may be used singly or in admixture. However, the present invention is not limited to these monomers.

Examples of the aldehydes employable herein include formaldehyde, paraformaldehyde, acetaldehyde, propylaldehyde, benzaldehyde, phenylacetaldehyde, (α-phenylpropylaldehyde, β-phenylpropylaldehyde, o-hydroxybenzaldehyde, m-hydroxybenz aldehyde, p-hydroxybenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenz aldehyde, p-n-butylbenzaldehyde, furfural, and acetalation products thereof. Preferred among these aldehydes is formaldehyde.

These aldehydes may be used singly or in combination. Examples of the acid catalyst employable herein include sulfuric acid, formic acid, acetic acid, and oxalic acid.

The molecular weight of the foregoing alkali-soluble resin is preferably from 2,000 to 1,000,000, more preferably from 3,000 to 50,000.

The content of the alkali-soluble resin free of acid-decomposable group is not more than 50% by weight, preferably not more than 30% by weight, more preferably not more than 20% by weight based on the sum of the alkali-soluble resin and the resin containing acid-decomposable group.

The photo acid generator (b) to be used in the present invention is a compound which generates an acid when irradiated with actinic rays or radiation.

As the compound of the present invention which generates an acid when irradiated with actinic rays or radiation there may be properly selected from the group consisting of photocationic polymerization initiator, photoradical polymerization initiator, dye photodecolorizer, photodiscolorizer, compound used in microresist which generates an acid when irradiated with known rays (ultraviolet rays having a wavelength of from 200 to 400 nm, far ultraviolet rays, particularly g-ray, h-ray, i-ray, KrF exima laser beam), ArF exima laser beam, electron rays, X-ray, molecular ray or ion beam, and mixture thereof.

Other employable examples of the compound which generates an acid when irradiated with actinic rays or radiation include diazonium salts described in S. I. Schlesinger, Photogr. Sci. Eng., 18, 387 (1974), T. S. Bal etal., Polymer, 21, 423 (1980), ammonium salts described in U.S. Pat. Nos. 4,069,055, 4,069,056, Re 27,992, and Japanese Patent Application No. 3-140,140, phosphonium salts described in D. C. Necker et al, Macromolecules, 17, 2468 (1984), C. S. Wen etal., Teh, Proc. Conf. Rad. Curing ASIA, p. 478, Tokyo, Oct (1988), and U.S. Pat. Nos. 4,069,055 and 4,069,056, iodonium salts described in J. V. Crivello et al., Macromelecules, 10 (6), 1307 (1977), Chem. & Eng. News, Nov. 28, p. 31 (1988), EP 104,143, U.S. Pat. Nos. 339, 049and410,201, JP-A-2-150848 and JP-A-2-296514, sulfonium salts described in J. V. Crivello et al., Polymer J. 17, 73 (1985), J. V. Crivelloetal., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), EP 370,693, EP 3,902,114, EP 233,567, EP 297,443, EP 297,442, U.S. Pat. Nos. 4,933,377, 161,811, 410,201, 339,049, 4,760,013, 4,734,444 and 2,833, 827, and German Patents 2,904,626, 3,604,580 and 3,604, 581, selenonium salts described in J. V. Crivello et al., Macromolecules, 10 (6), 1307 (1977), J. V. Crivello et al., J. Polymer Sci., Polymer Chem. Ed., 17, 1047 (1979), onium salts such as arsonium salt described in C. S. Wen etal., Teh, Proc. Conf. Rad. Curing ASIA, p. 478 Tokyo, October (1988), organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339, organic metal compounds and organic halides described in K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1896), JP-A-2-161445, photo acid generators containing o-nitrobenzyl type protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amitetal., Tetrahedron Lett., (24) 2205 (1973), D. H. R. Barton et al., J. Chem. Soc., 3571 (1965), P. M. Collins et al., J. Chem. Soc., Perkin I. 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc. Chem. Commun., 532 (1972), S. Hayase et al., Macromolecules, 18, 1799 (1985), E. Reichmanisetal., J. Electrochem. Soc., Solid State Sci. Technol., 130 (6), F. M. Houlihan et al., Macromolecules, 21, 2001 (1988), EP 0290,750, EP 046, 083, EP 156,535, EP 271,851, EP 0,388,343, U.S. Pat. Nos. 3,901,710 and 4,181,531, and JP-A-60-198538 and JP-A-53-133022, compounds which undergo photodecomposition to generate an sulfonic acid such as iminosulfonate described in M. Tunooka etal., Polymer Preprints Japan, 35 (8), G. Berner etal., J. Rad. Curing, 13 (4), W. J. Mijs et al., Coating Technol., 55 (697), 45(1983), Akxo, H. Adachietal., Polymer Preprints, Japan, 37 (3), EP 0199,672, EP 84515, EP 199,672, EP 044,115, EP 0101,122, U.S. Pat. Nos.

618,564, 4,371,605 and 4,431,774, JP-A-64-18143, JP-A-2-245756, and Japanese Patent Application No. 3-140109, and disulfone compounds described in JP-A-61-166544.

Further, compounds having these photo acid generating groups or compounds incorporated in its polymer main chain or side chain as described in M. E. Woodhouse et al., J. Am. Chem. Soc., 104, 5586 (1982), S. P. Pappas et al., J. Imaging Sci., 30 (5), 218 (1986), S. Kondo et al., Makromol. Chem., Rapid Commun., 9, 625 (1988), Y. Yamadaetal. , Makromol. Chem., 152, 153, 163 (1972), J. V. Crivello et al., J. Polymer Sci., Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029 may be used.

Moreover, compounds which generate an acid when irradiated with light described in V. N. R. Pillai, Synthesis, (1), 1 (1980), A. Abadm et al., Tetrahedron Lett., (47) 4555 (1971), D. H. R. Barton et al., J. Chem. Soc., (C), 329 (1970), U.S. Pat. No. 3,779,778, and EP 126,712 may be used.

Particularly effective examples of the foregoing compound which generates an acid when irradiated with actinic rays or radiation will be described hereinafter.

(1) Oxazole derivative substituted by trihalomethyl group represented by the following general formula (PAG1) or S-triazine derivative represented by the following general formula (PAG2):

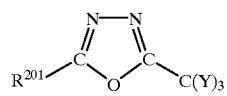

(PAG1)

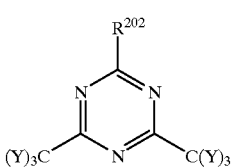

(PAG2)

Wherein $R^{201}$ represents a substituted or unsubstituted aryl or alkenyl group; $R^{202}$ represents a substituted or unsubstitutedaryl, alkenyl or alkenyl group or $-C(Y)_3$; and Y represents a chlorine or bromine atom.

Specific examples of the foregoing groups will be given below, but the present invention should not be construed as being limited thereto.

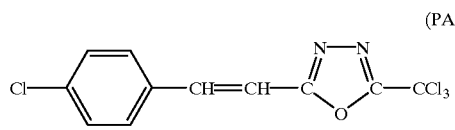

(PAG1-1)

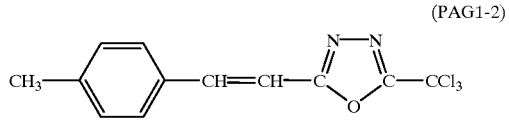

(PAG1-2)

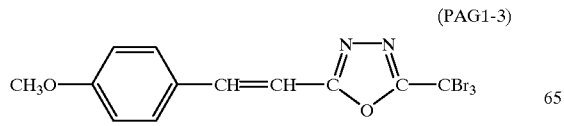

(PAG1-3)

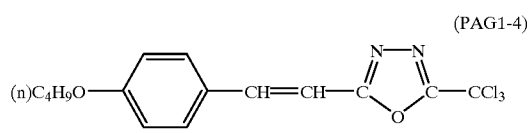

(PAG1-4)

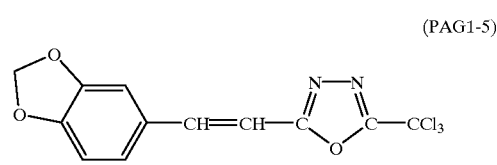

(PAG1-5)

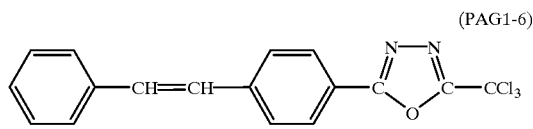

(PAG1-6)

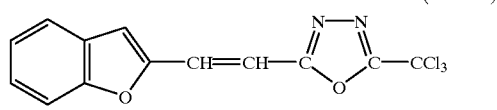

(PAG1-7)

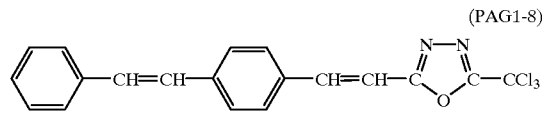

(PAG1-8)

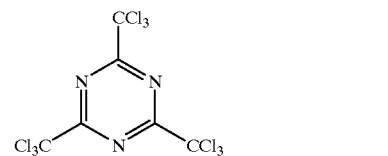

(PAG2-1)

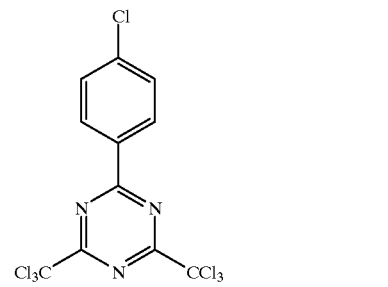

(PAG2-2)

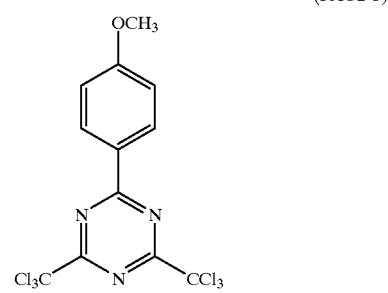

(PAG2-3)

-continued (PAG2-4)
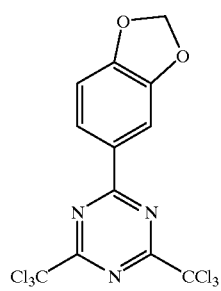

(PAG2-5)
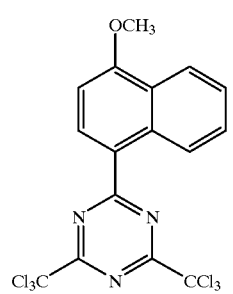

(PAG2-6)
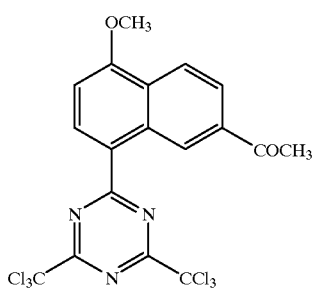

(PAG2-7)
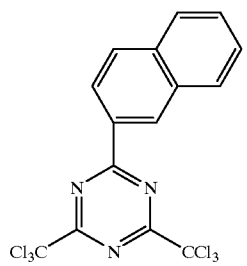

(PAG2-8)
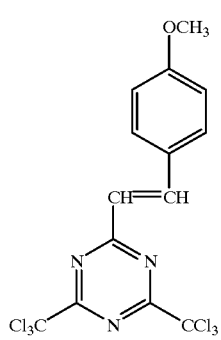

-continued (PAG2-9)
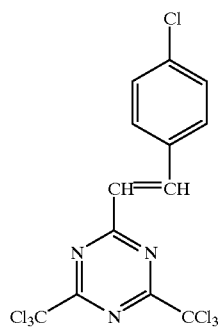

(PAG2-10)
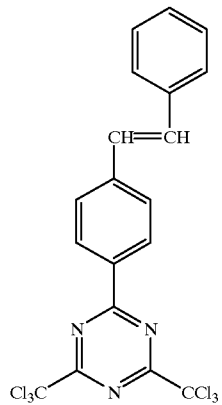

(2) Iodonium salt represented by the following general formula (PAG3) or sulfonium salt represented by the following general formula (PAG4):

(PAG3)

(PAG4)
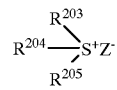

In the foregoing general formulae (PAG3) and (PAG4), $Ar^1$ and $Ar^2$ each independently represent a substituted or unsubstituted aryl group. Preferred examples of substituents on the aryl group include alkyl group, haloalkyl group, cycloalkyl group, aryl group, alkoxy group, nitro group, carboxyl group, alkoxycarbonyl group, hydroxyl group, mercapto group, andhalogen atom.

$R^{203}$, $R^{204}$ and $R^{205}$ each independently represent a substituted or unsubstituted alkyl or aryl group, preferably a $C_{6-14}$ aryl group, $C_{1-8}$ alkyl group or substituted derivative thereof. Preferred examples of substituents on these aryl groups include $C_{1-8}$ alkoxy group, $C_{1-8}$ alkyl group, cycloalkyl group, nitro group, carboxyl group, mercapto group, hydroxyl group, and halogen atom. Preferred examples of substituents on these alkyl groups include $C_{1-8}$ alkoxy, carboxyl and alkoxycarbonyl groups.

$Z^-$ represents a counter anion. Examples of the counter ion include perfluoroalkanesulfonic acid anion such as $CF_3SO_3^-$, $BF_4^-$, $AsF_6^-$, $PF_6^-$, $SbF_6^-$, $SiF_6^-$, $ClO_4^-$, condensed polynuclear aromatic sulfonic acid anion such as pentafluoro bezenesulfonic acid anion and naphthalene-1-sulfonic acid anion, anthraquinonesulfonic acid anion, and sulfonic acid group-containing dye. However, the present invention is not limited to these anions.

Two of $R^{203}$, $R^{204}$ and $R^{205}$, and $Ar^1$ and $Ar^2$ may be connected to each other via its own single bond or substituent.

Photo acid generators which are little liable to change of properties (T-Top formation, change of line width, etc.) with time between after exposure and heat treatment are desirable. An example of such photo acid generators is one represented by the foregoing general formula (PAG3) or (PAG4) wherein $Ar^1$, $Ar^2$ and $R^{203}$ to $R^{205}$ each represent a substituted or unsubstituted aryl group, and $Z^-$ exhibits a relatively small diffusibility in the resist layer when generated as an acid upon irradiation with light. In some detail, $Z^-$ represents an anion of benzenesulfonic acid, naphthalenesulfonic acid or anthracenesulfonic acid containing at least one group selected from the group consisting of branched or cyclic alkyl or alkoxy groups each having 8 or more carbon atoms, at least two groups selected from the group consisting of straight-chain, branched or cyclic $C_{4-7}$ alkyl or alkoxy groups or at least three groups selected from the group consisting of straight-chain or branched $C_{1-3}$ alkyl or alkoxy groups.

The photoresist composition of the present invention preferably comprises a compound represented by the foregoing general formula (VII) incorporated therein as the photo acid generating compound (b) to further inhibit the loss of lone pattern.

$R_9$'s each independently represent a hydrogen atom or $C_{3-16}$ branched alkyl group, with the proviso that at least one of $R_9$'s is not a hydrogen atom. Examples of the $C_{3-16}$ branched alkyl group represented by $R_9$ include iso-propyl group, sec-butyl group, iso-butyl group, t-butyl group, iso-pentyl group, neo-pentyl group, t-pentyl group, and iso-hexyl group. A branched alkyl group comprising $C_{3-16}$ hydrocarbon is desirable. The number of branches in the alkyl group is preferably not less than 1. Preferred among these alkyl groups represented by $R_9$ are iso-propyl group, and t-butyl group. The content of the above defined compound is preferably at least 20% by weight based on the total weight of the photo acid generating compounds used. The above defined compound may be used in combination with other photo acid generating compounds depending on the purpose.

Specific examples of other photo acid generating compounds will be given below, but the present invention should not be construed as being limited thereto.

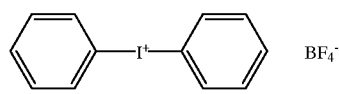

(PAG3-1)

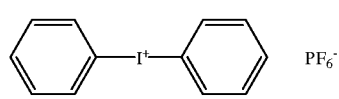

(PAG3-2)

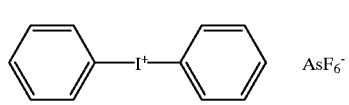

(PAG3-3)

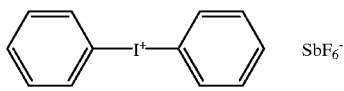

(PAG3-4)

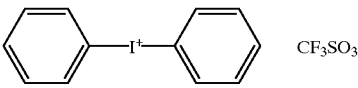

(PAG3-5)

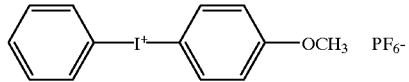

(PAG3-6)

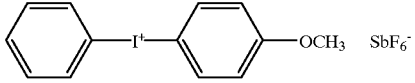

(PAG3-7)

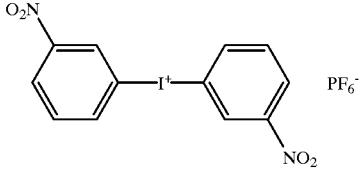

(PAG3-8)

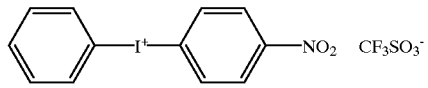

(PAG3-9)

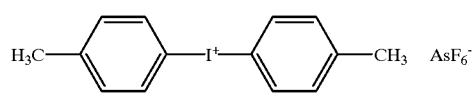

(PAG3-10)

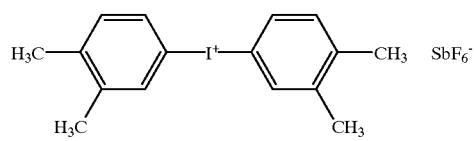

(PAG3-11)

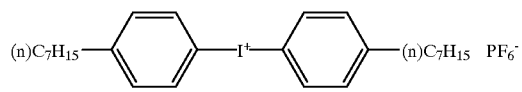

(PAG3-12)

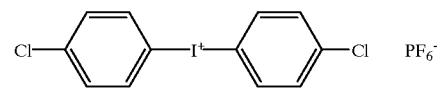

(PAG3-13)

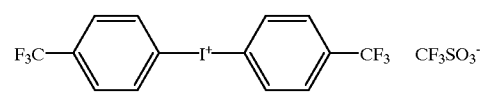

(PAG3-14)

(PAG3-15)
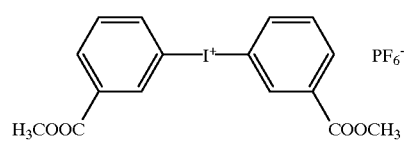
(PAG3-16)
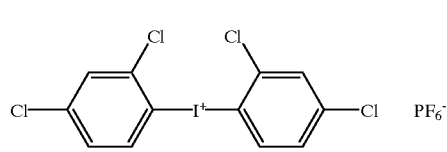
(PAG3-17)
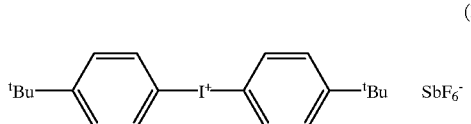
(PAG3-18)
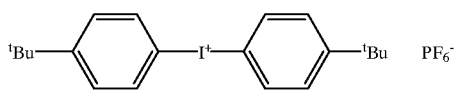
(PAG3-19)
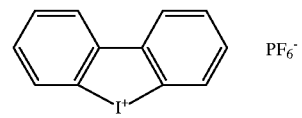
(PAG3-20)
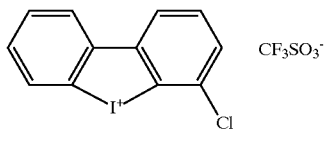
(PAG3-21)
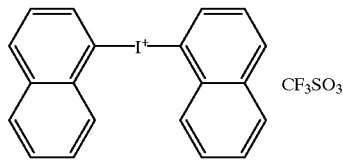
(PAG3-22)
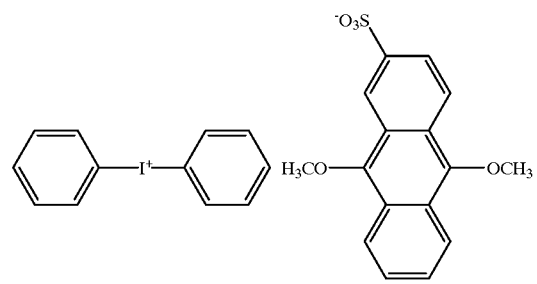
(PAG3-23)
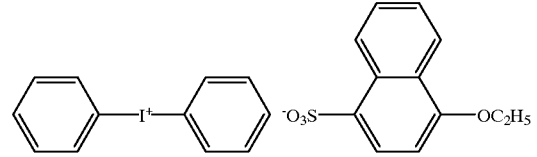
(PAG3-24)
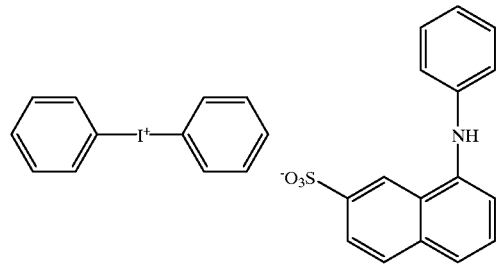
(PAG3-25)
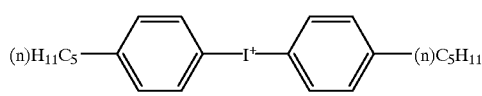
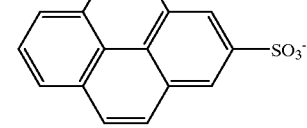
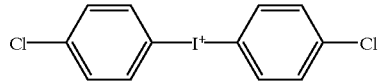
(PAG3-26)
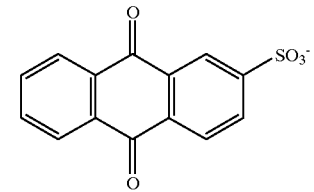
(PAG3-27)
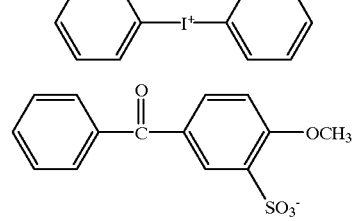
(PAG3-28)
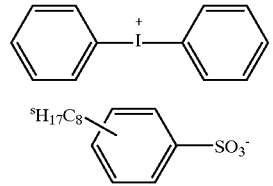
(PAG3-29)
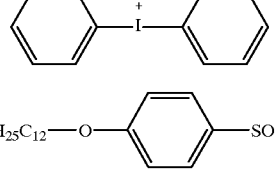

(PAG3-30) — (PAG3-40)

-continued
(PAG4-1)
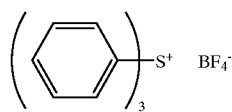
(PAG4-2)
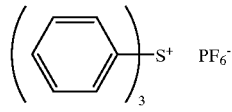
(PAG4-3)
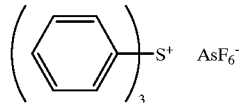
(PAG4-4)
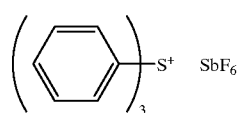
(PAG4-5)
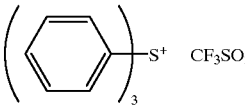
(PAG4-6)
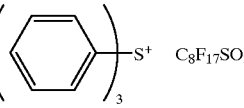
(PAG4-7)
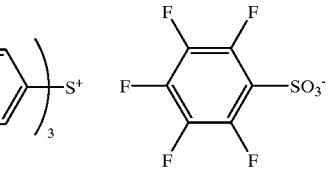
(PAG4-8)
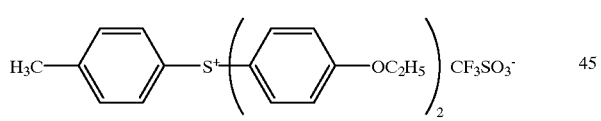
(PAG4-9)
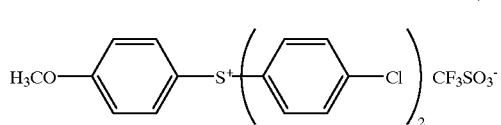
(PAG4-10)
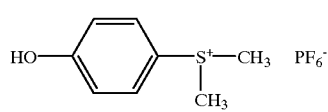
(PAG4-11)
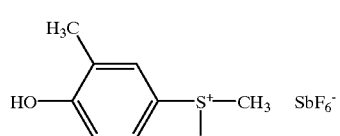
-continued
(PAG4-12)
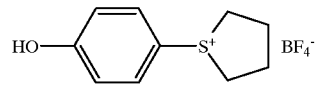
(PAG4-13)
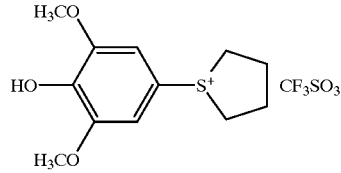
(PAG4-14)
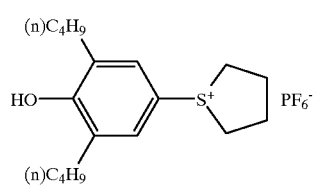
(PAG4-15)
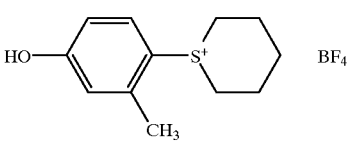
(PAG4-16)
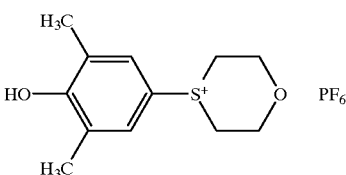
(PAG4-17)
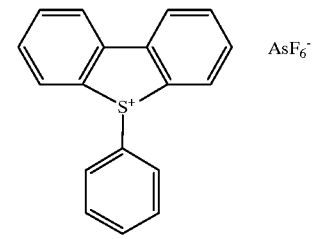
(PAG4-18)
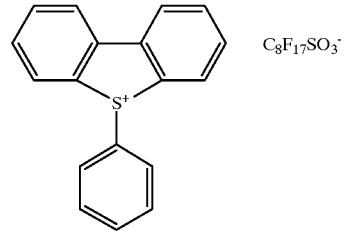
(PAG4-19)
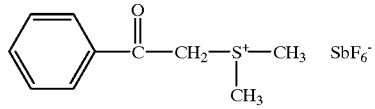
(PAG4-20)
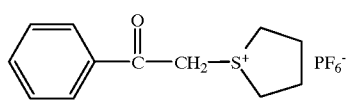

(PAG4-21)
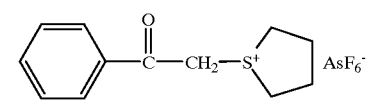
(PAG4-22)
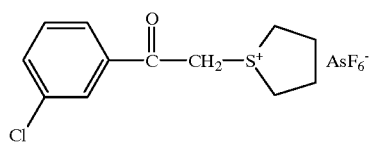
(PAG4-23)
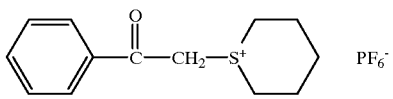
(PAG4-24)
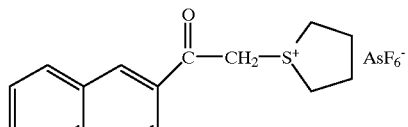
(PAG4-25)
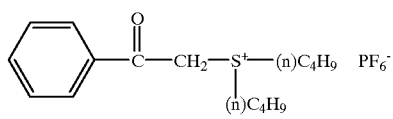
(PAG4-26)
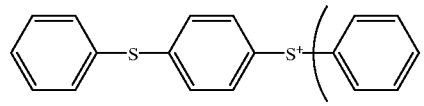
(PAG4-27)
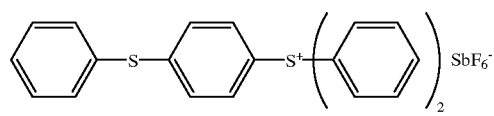
(PAG4-28)
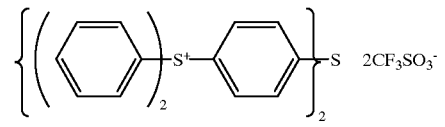
(PAG4-29)
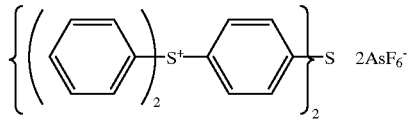
(PAG4-30)
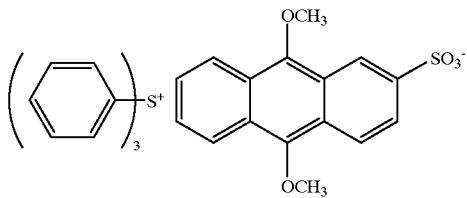
(PAG4-31)
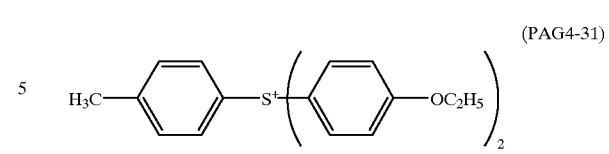
(PAG4-32)
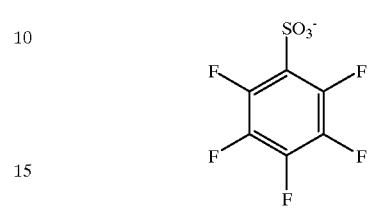
(PAG4-33)
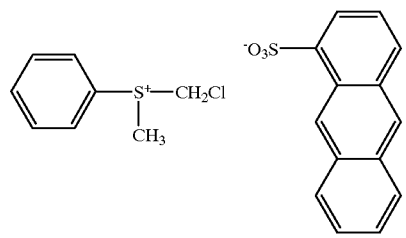
(PAG4-34)
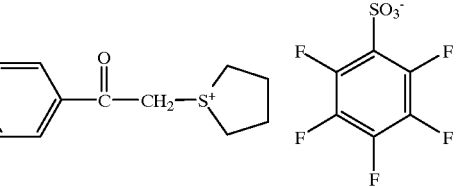
(PAG4-35)
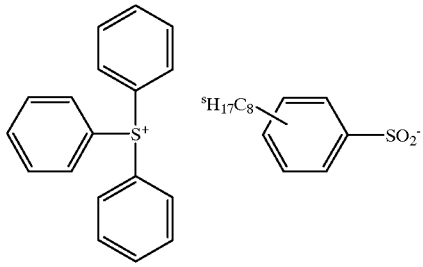

(PAG4-36)
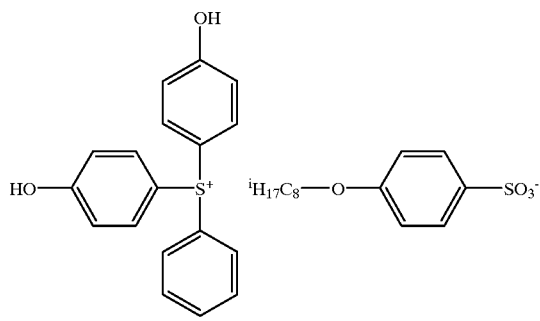
(PAG4-41)
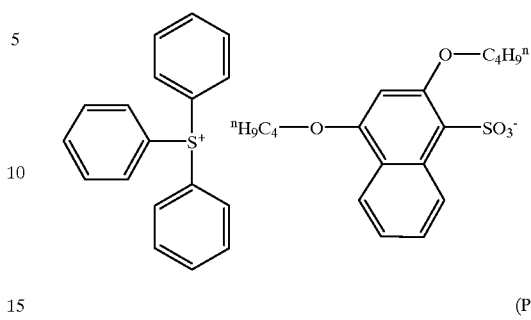
(PAG4-37)
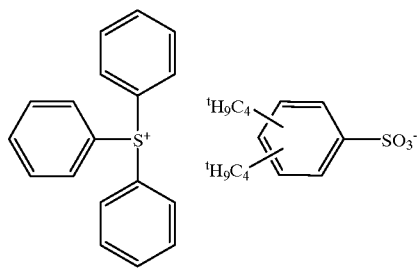
(PAG4-42)
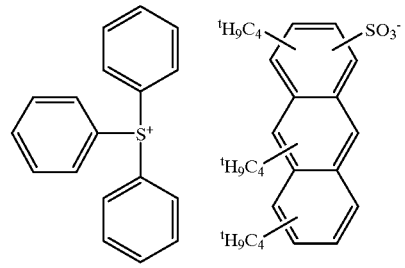
(PAG4-38)
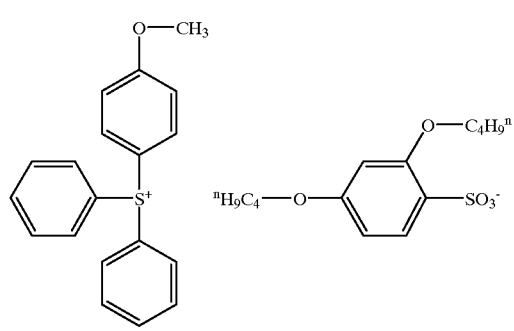
(PAG4-43)
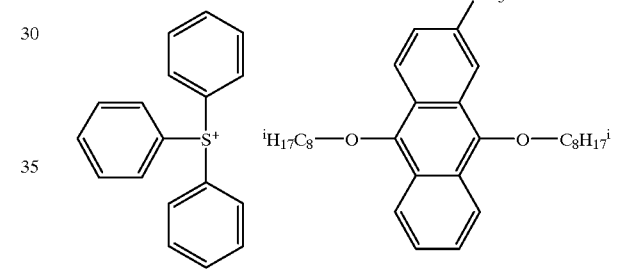
(PAG4-39)
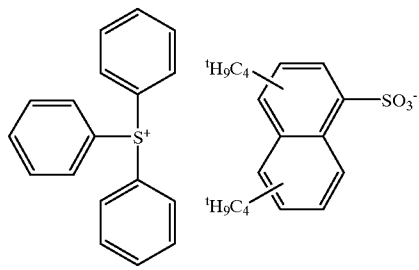
(PAG4-44)
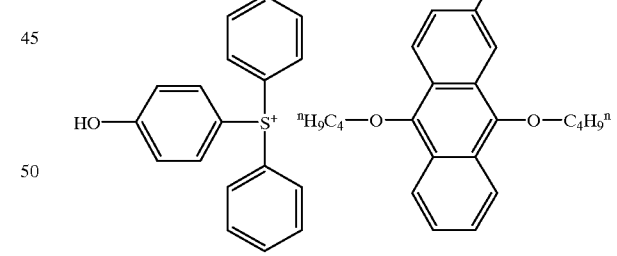
(PAG4-40)
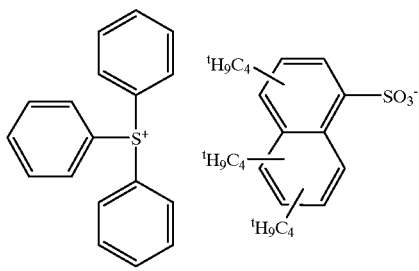
(PAG4-45)
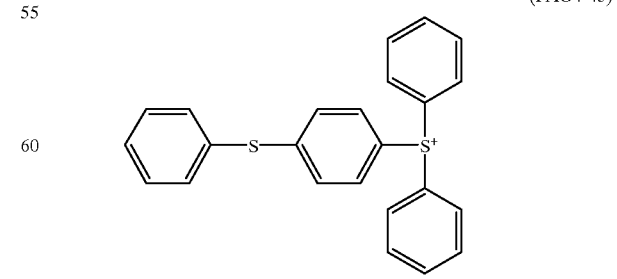

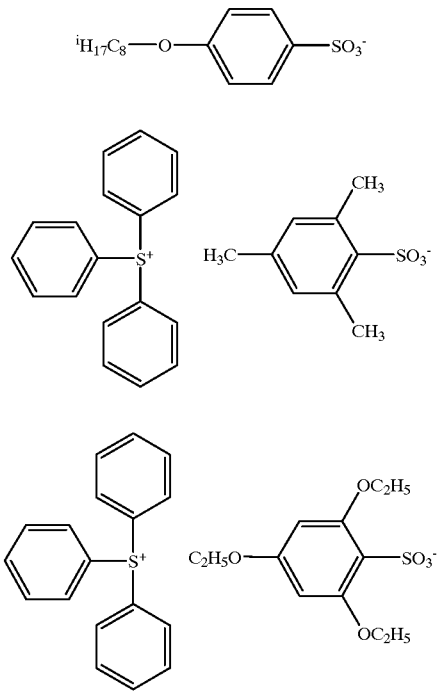

(PAG4-46)

(PAG4-47)

 (PAG5-1)

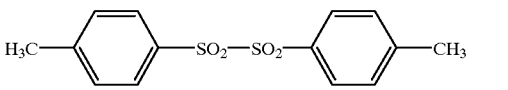 (PAG5-2)

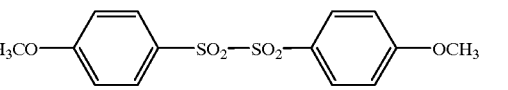 (PAG5-3)

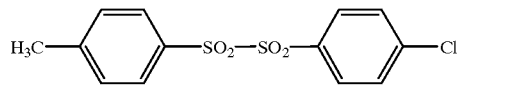 (PAG5-4)

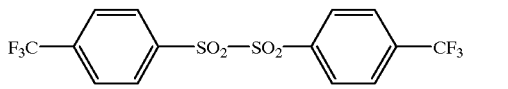 (PAG5-5)

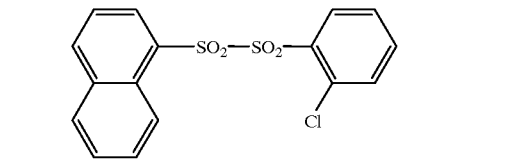 (PAG5-6)

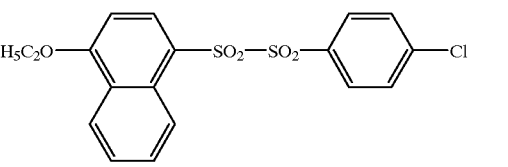 (PAG5-7)

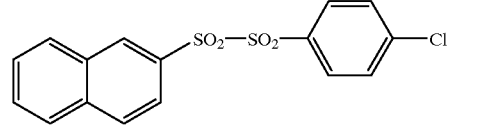 (PAG5-8)

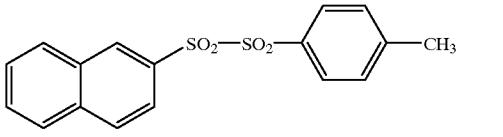 (PAG5-9)

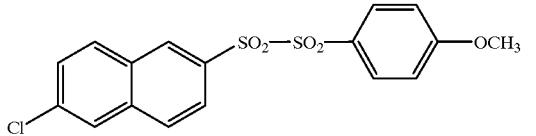 (PAG5-10)

The foregoing onium salts represented by the foregoing general formulae (PAG3) and (PAG4) are known. The synthesis of these onium salts can be accomplished by the methods described in J. W. Knapczyk et al., J. Am. Chem. Soc., 91, 145 (1969), A. L. Maycok et al., J. Org. Chem., 35, 2532, (1970), E. Goethas et al., Bull. Soc. Chem. Belg., 73, 546, (1964), H. M. Leicester, J. Ame. Chem. Soc., 51, 3587 (1929), J. V. Crivello et al., J. Polym. Chem. Ed., 18, 2677 (1980), U.S. Pat. Nos. 2,807,648 and 4,247,473, and JP-A-53-101,331.

(3) Disulfone derivative represented by the following general formula (PAG5) or iminosulfonate derivative represented by the general formula (PAG6):

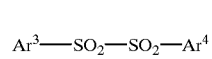 (PAG5)

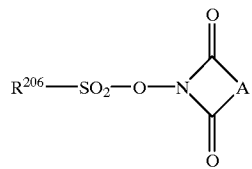 (PAG6)

wherein $Ar^3$ and $Ar^4$ each independently represent a substituted or unsubstituted aryl group; $R^{206}$ represents a substituted or unsubstituted alkyl or aryl group; and A represents a substituted or unsubstituted alkylene, alkenylene or arylene group.

Specific examples of these compounds will be given below, but the present invention should not be construed as being limited thereto.

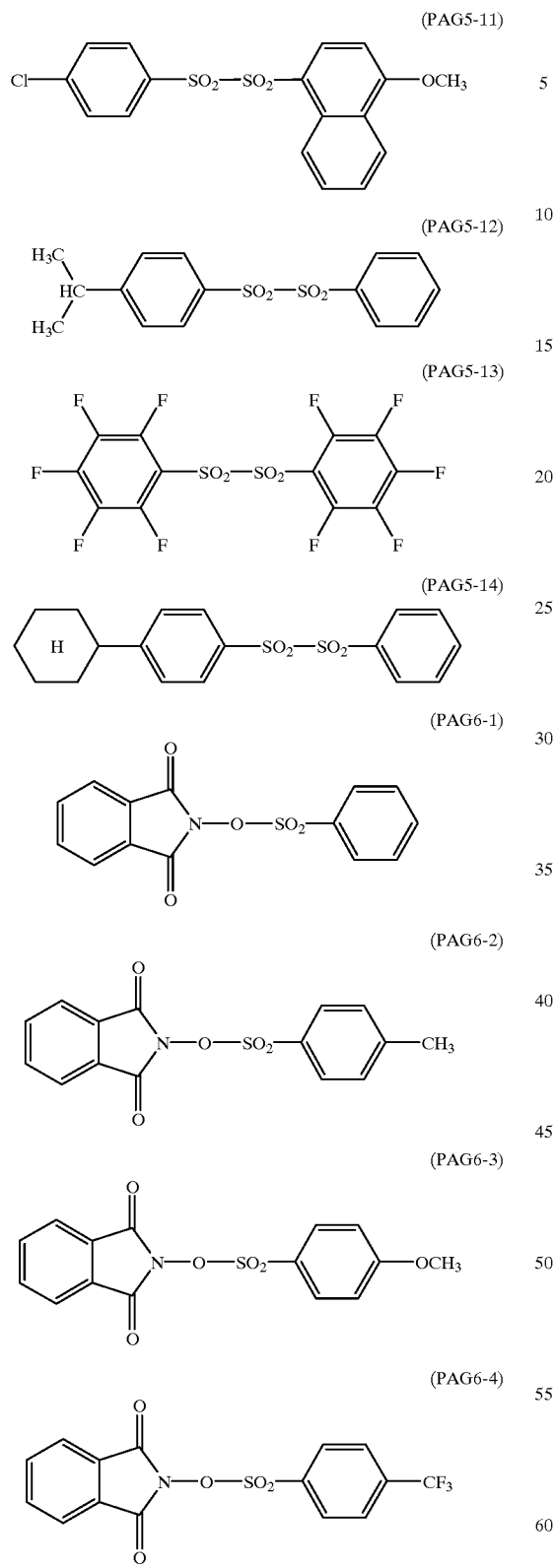
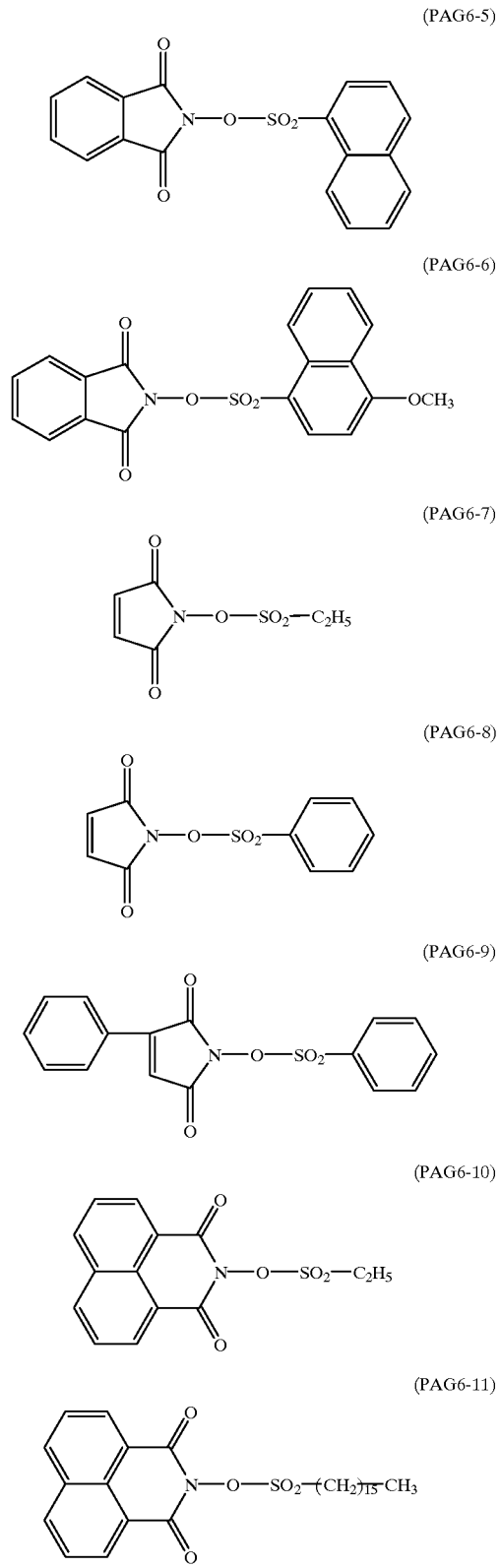

(PAG6-12)

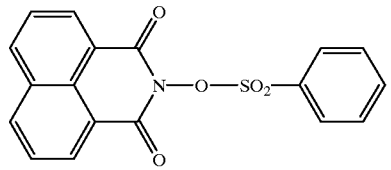

(PAG6-13)

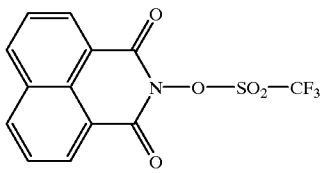

(PAG6-14)

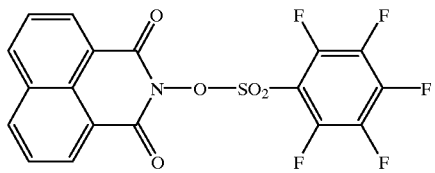

(PAG6-15)

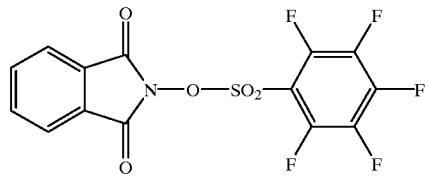

In the present invention, the compound (b) which generates an acid when irradiated with actinic rays or radiation is preferably an onium salt, disulfone, 4-position DNQ sulfonic acid ester or triazine compound. More preferably, at least one onium salt is used. A sulfonium salt having a benzenesulfonic acid anion moiety containing a branched alkyl group represented by the general formula (VII) is particularly preferred.

The content of the compound (b) which generates an acid when irradiated with actinic rays or radiation is normally from 0.001 to 40% by weight, preferably from 0.01 to 20% by weight, more preferably from 0.1 to 5% by weight, based on the total weight of the positive-working photoresist composition of the present invention (excluding coating solvent). If the content of the compound (b) which generates an acid when irradiated with actinic rays or radiation falls below 0.001% by weight, the resulting positive-working photoresist composition exhibits a reduced sensitivity. On the contrary, if the content of the compound (b) which generates an acid when irradiated with actinic rays or radiation exceeds 40% by weight, the resulting positive-working photoresist composition exhibits too high a light absorption and hence shows a deteriorated profile or a narrow process (particularly bake) margin.

The positive-working photoresist composition of the present invention may comprise an organic basic compound incorporated therein. In this arrangement, the positive-working photoresist composition of the present invention can advantageously exhibit an enhanced storage stability and a less change of line width.

The organic basic compound which can be preferably used in the present invention is a compound having a stronger basicity than phenol. In particular, nitrogen-containing basic compounds are desirable.

Preferred examples of chemical environment include the following structural formulae (A) to (E):

(A)

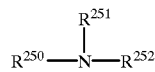

wherein $R^{250}$, $R^{251}$ and $R^{252}$ may be the same or different and each represent a hydrogen atom, $C_{1-6}$ alkyl, aminoalkyl or hydroxyalkyl group or $C_{6-20}$ substituted or unsubstituted aryl group, with the proviso that $R^{251}$ and $R^{252}$ may be connected to each other to form a ring.

(B)

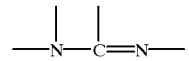

(C)

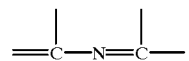

(D)

(E)

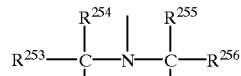

wherein $R^{253}$, $R^{254}$, $R^{255}$ and $R^{256}$ may be the same or different and each represent a $C_{1-6}$ alkyl group.

An even more desirable compound is a nitrogen-containing compound two or more nitrogen atoms having different chemical environments per molecule, particularly a compound containing both a cyclic structure having a substituted or unsubstituted amino group and a cyclic structure having nitrogen atom or a compound having alkylamino group. Specific preferred examples of these compounds include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstitutedpyrazine, substituted or unsubstitutedpyrimidine, substituted or unsubstituted purine, substituted or unsubstituted imidazoline, substituted or unsubstituted pyrazoline, substituted or unsubstitutedpiperazine, substituted or unsubstituted aminomorpholine, and substituted or unsubstituted aminoalkylmorpholine. Preferred examples of substituents on these compounds include amino group, aminoalkyl group, alkylamino group, aminoaryl group, arylamino group, alkyl group, alkoxy group, acyl group, acyloxy group, aryl group, aryloxy group, nitro group, hydroxyl group, and cyano group. Particularly preferred examples of these compounds include guanidine, 1, 1-dimethylguanidine, 1, 1, 3, 3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethyl pyridine, 4-aminoethylpyridine, 3-aminopyrrolidine, piperadine, N-(2-aminoethyl)piperadine, N-(2-aminoethyl)piperidine, 4-amino-2, 2, 6, 6-tetramethylpiperidine, 4-piperidinopiperidine, 2-iminopiperidine, 1-(2-aminoethyl)-pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2, 4-diaminopyrimidine, 4, 6-dihydroxypyrimidine, 2-pyrazoline, 3-pyrazoline, N-aminomorpholine, and N-(2-aminoethyl) morpholine. However, the present invention is not limited to these compounds.

These nitrogen-containing basic compounds may be used singly or in combination. The amount of the nitrogen-containing basic compound to be used is normally from 0.001 to 10 parts by weight, preferably from 0.01 to 5 parts by weight based on 100 parts by weight of the photosensitive resin composition (excluding solvent). If the amount of the nitrogen-containing basic compound to be used falls below 0.001 parts by weight, the desired effect of the present invention cannot be exerted. On the contrary, if the amount of the nitrogen-containing basic compound to be used exceeds 10 parts by weight, the resulting positive-working photoresist composition tends to exhibit a reduced sensitivity or deteriorated developability of unexposed area.

The chemically-sensitized positive-working resist composition of the present invention may further comprise a surface active agent, a dye, a pigment, a plasticizer, a photosensitizer, a compound containing two or more phenolic OH groups for accelerating solubility in a developer, etc. incorporated therein.

Specific preferred examples of the surface active agent employable herein include nonionic surface active agents such as polyoxyethylene alkyl ether (e.g., polyoxyethylene lauryl ether, polyoxyethylene stearyl ether, polyoxyethylene cetyl ether, polyoxyethylene oleyl ether), polyoxyethylene alkyl allyl ether (e.g., polyoxyethylene octyl phenol ether, polyoxyethylene nonyl phenol ether), polyoxyethylene-polyoxypropylene block copolymer, sorbitanaliphatic acid ester (e.g., sorbitan monolaurate, sorbitan monopalmitate, sorbitan monostearate, sorbitan monoleate, sorbitan trioleate, sorbitan tristearate) and polyoxyethylenesorbitan aliphatic acid ester (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate), fluorine surface active agents such as Eftop EF301, EF303, EF352 (produced by New Akita Chemical Corp.), Megafac F171, F173 (produced by DAINIPPON INK & CHEMICALS, INC.), Florad FC430, FC431 (produced by Sumitomo 3M Corp.), Asahi Guard AG710 and SURFLON S-382, SC101, SC102, SC103, SC104, SC105, SC106 (produced by Asahi Glass Co., Ltd.), Organosiloxane polymer KP341 (produced by Shin-Etsu Chemical Co., Ltd.), and acrylic or methacrylic acid (co) polymer Polyflow Nos. 75 and 95 (produced by Kyoeisha Chemical Co., Ltd.).

These surface active agents may be used singly. Alternatively, some of these surface active agents may be used in combination. The content of the surface active agent is preferably from 0.0005 to 0.01 parts by weight based on 100 parts by weight of the composition (excluding solvent).

Preferred examples of the foregoing dye include oil-based dyes and basic dyes. Specific examples of these dyes include oil yellow #101, oil yellow #103, oil pink #312, oil green BG, oil blue BOS, oil blue #603, oil black BY, oil black BS, oil black T-505 (produced by Orient Chemical Industries Limited), crystal violet (CI42555), methyl violet (CI42535), rhodamine B (CI45170B), malachite green (CI42000), and methylene blue (CI52015).

The photosensitive composition of the present invention may further comprise a spectral sensitizer described below incorporated therein so that it is sensitized to a wavelength range longer than far ultraviolet range where the photo acid generator has no absorption to render itself sensitive to i- or g-ray. Specific examples of preferred spectral sensitizers include benzophenone, p, p'-tetramethyldiaminobenzophenone, p, p'-tetraethylethlamino benzophenone, 2-chlorothioxanthone, anthrone, 9-ethoxyanthracene, anthracene, pyrene, perylene, phenothiazine, benzyl, acridine orange, benzoflavine, cetoflavine-T, 9, 10-diphenylanthracene, 9-fluorenone, acetophenone, phenanthrene, 2-nitrofluorenone, 5-nitro-acenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethyl anthraquinone, 2-tert-butyl-anthraquinone, 1, 2-benzanthraquinone, 3-methyl-1, 3-diaza-1, 9-benzanthrone, dibenzalacetone, 1, 2-naphthoquinone, 3, 3'-carbonyl-bis (5, 7-dimethoxycarbonylcoumarin), and coronene. However, the present invention is not limited to these spectral sensitizers.

As the compound containing two or more phenolic OH groups for accelerating solubility in a developer there may be used a polyhydroxy compound. Preferred examples of such a polyhydroxy compound include phenols, resorcin, phloroglucine, 2, 3, 4-trihydroxybenzophenone, 2, 3, 4, 4'-tetrahydroxybenzophenone, ($\alpha$, $\alpha$', $\alpha$"-tris(4-hydroxyphenyl)-1, 3, 5-triisopropylbenzene, tris(4-hydroxyphenyl)methane, tris (4-hydroxyphenyl)ethane, and 1, 1'-bis(4-hydroxyphenyl) cyclohexane.

The chemically-sensitized positive-working resist composition of the present invention may be applied to a support in the form of solution in the solvent (d) for dissolving the foregoing various components therein. Preferred examples of the solvent employable herein include ethylene dichloride, cyclohexanone, cyclopentanone, 2-heptanone, å-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N, N-dimethylformamide, dimethyl sulfoxide, N-methylpyrrolidone, and tetrahydrofurane. These solvents may be used singly or in admixture.

The chemically-sensitized positive-working photoresist composition thus obtained may be applied to a substrate (e.g., silicon/silicon dioxide-coated substrate) for use in the production of precision integrated circuit element by means of a proper coating device such as spinner and coater, exposed to light through a predetermined mask, baked, and then developed to obtain a good resist pattern.

As the developer for the chemically-sensitized positive-working photoresist composition of the present invention there may be used an aqueous solution of an alkaline material such as inorganic alkali (e.g., sodium hydroxide, potassium hydroxide, sodium carbonate, sodium silicate, sodium metasilicate, aqueous ammonia), primary amine (e.g., ethylamine, n-propylamine), secondary amine (e.g., diethylamine, di-n-butylamine), tertiary amine (e.g., triethylamine, methyldiethylamine), alcoholamine (e.g., diemthylethanolamine, triethanolamine), amide (e.g., formamide, acetamide), quaternary ammonium salt (e.g., tetramethylammonium hydroxide, trimethyl(2-hydroxyethyl) ammonium hydroxide, tetraethylammonium hydroxide, tributylmethylammonium hydroxide, tetraethanolammonium hydroxide, methyltriethanolammonium hydroxide, benzylmethyl diethanolammonium hydroxide, benzyldimethylethanolammonium hydroxide, benzyltriethanolammonium hydroxide, tetrapropyl ammonium hydroxide, tetrabutylammonium hydroxide) and cyclic amine (e.g., pyrrole, piperidine).

The present invention will be further described in the following examples, but the present invention should not be construed as being limited thereto.

SYNTHESIS EXAMPLE a-1: copolymer 84.1 g of p-vinylphenol and 38.5 g of t-butyl acrylate were dissolved in 150 g of dioxane. A stream of nitrogen was then introduced into the solution for 1 hour.

To the solution was then added 6.91 g of 2, 2'-dimethyl azobisisobutyrate. The mixture was then heated to a temperature of 75° C. in a stream of nitrogen where it was allowed to undergo polymerization for 12 hours. After the termination of polymerization, the reaction solution was allowed to cool to room temperature. The reaction solution was then diluted with 150 g of acetone. The reaction solution was then added dropwise to a large amount of hexane to obtain a solid polymer. The dilution with acetone and the dropwise addition to hexane were repeated three times to remove residual monomers. The resulting polymer was vacuum-dried at a temperature of 60° C. to obtain a polymer a-1.

The analysis of the product by NMR shows that the composition ratio of p-vinylphenol:t-butyl acrylate is 68:32. The polymer a-1 exhibited Mw of 12,000 and a dispersibility (Mw/Mn) of 2.6.

SYNTHESIS EXAMPLE a-2 to a-6: copolymer

Copolymers a-2 to a-6 were produced in the same manner as in Synthesis Example a-1 except that the monomers set forth in Table 1 (charged amount: g) were used instead of p-vinylphenol and t-butyl acrylate, respectively.

reduced to 20 mmHg where PGMEA and water were then azeotropically removed. The reaction solution thus azeotropically dehydrated was then allowed to cool to a temperature of 20° C. To the reaction solution was then added 0.22 g of a divinylether compound represented by the following general formula (B). To the mixture was then added 3 mg of p-toluenesulfonic acid. After the termination of addition, the reaction mixture was then allowed to undergo reaction for 2 hours. The reaction solution was then neutralized with a small amount of triethylamine. Thereafter, to the reaction solution was added ethyl acetate. The reaction solution was then washed with ion-exchanged water to remove salts therefrom. Ethyl acetate and water were then distilled off the reaction solution under reduced pressure to obtain a PGMEA solution of partially crosslinked copolymer A-1 as the desired product.

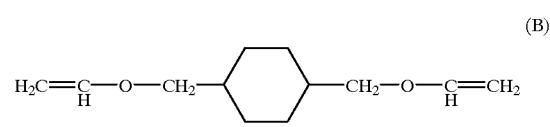

(B)

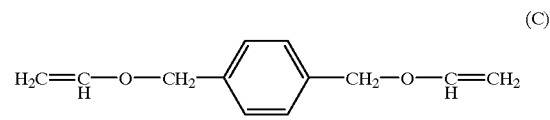

(C)

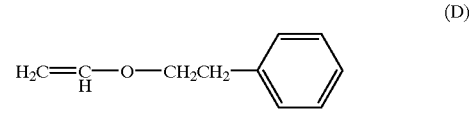

(D)

SYNTHESIS EXAMPLE A-2: partially crosslinked copolymer 20 g of the polymer obtained in Synthesis Example a-1 was dissolved in 80 g of PGMEA. The solution was then

TABLE 1

| Synthesis Example No. | Monomer (charged amount: g) | Ratio of compositions in polymer | Mw | Mw/Mn |
|---|---|---|---|---|
| a-1 | p-Hydroxystyrene/t-butyl acrylate<br>84.1 g/38.5 g | 68:32 | 12,000 | 2.6 |
| a-2 | p-Hydroxystyrene/t-butyl acrylate<br>72.1 g/51.3 g | 57:43 | 13,800 | 2.7 |
| a-3 | p-Hydroxystyrene/styrene/t-butyl acrylate<br>84.1 g/10.4 g/25.6 g | 67:11:22 | 13,100 | 2.7 |
| a-4 | p-Hydroxystyrene/1-methyl-1-cyclohexyl acrylate<br>84.1 g/50.5 g | 69:31 | 9,700 | 2.5 |
| a-5 | p-Hydroxystyrene/p-t-butylstyrene/t-butyl acrylate<br>84.1 g/16.0 g/25.6 g | 69:10:21 | 14,100 | 2.8 |
| a-6 | p-Hydroxystyrene/p-acetoxystyrene/t-butyl acrylate<br>72.1 g/16.2 g/38.5 g | 57:12:31 | 17,500 | 2.9 |

SYNTHESIS EXAMPLE A-1: partially-crosslinked copolymer 20 g of the polymer obtained in Synthesis Example a-1 was dissolved in 80 g of propylene glycol monoethyl ether acetate (PGMEA). The solution was then heated to a temperature of 60° C. The pressure in the system was gradually heated to a temperature of 60° C. The pressure in the system was gradually reduced to 20 mmHg where PGMEA and water were then azeotropically removed. The reaction solution thus azeotropically dehydrated was then allowed to cool to a temperature of 20° C. To the reaction solution were then added 0.22 g of the foregoing divinylether compound (B)

and 2.46 g of the foregoing phenethyl vinyl ether (D). To the mixture was then added 3mg of p-toluenesulfonic acid. Thereafter, to the reaction solution was added ethyl acetate. The reaction solution was then washed with ion-exchanged water to remove salts therefrom. Ethyl acetate and water were then distilled off the reaction solution under reduced pressure to obtain a PGMEA solution of partially crosslinked copolymer A-2 as the desired product.

SYNTHESIS EXAMPLES A-3 to A-9: partially crosslinked copolymer

Copolymers A-3 to A-9 according to the present invention were produced in the same manner as in Synthesis Example A-1 except that copolymers and divinyl ether compounds having a predetermined solid content set forth in Table 2 below were used instead of the copolymer a-1 and vivinyl ether compound used in the foregoing synthesis examples, respectively.

The structure of the copolymers thus obtained are set forth in Table 2 as the number of corresponding exemplary structures described herein.

The composition ratio is represented by mol %. The figure in the composition ratio set forth in the table corresponds to the ratio of component in the order starting from the left side of the structure.

The structure of the copolymers thus obtained are set forth in Table 2 as the number of corresponding exemplary structures described herein. The composition ratio is represented by mol %. The figure in the composition ratio set forth in the table corresponds to the ratio of component in the order starting from the left side of the structure.

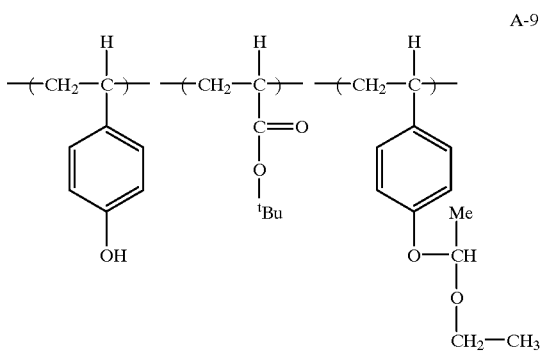

TABLE 2

| Synthesis Example No. | Polymers used | Vinyl ether g | Polymer structure* | Composition ratio* | Mw |
|---|---|---|---|---|---|
| A-1 | a-1 | B 0.22 | [1] | 67:32:1 | 25,200 |
| A-2 | a-1 | B/D 0.22/2.46 | [6] | 54:32:13:1 | 26,800 |
| A-3 | a-2 | C 0.35 | [4] | 55:43:2 | 117,100 |
| A-4 | a-3 | B 0.33 | [5] | 65:22:11:2 | 123,600 |
| A-5 | a-3 | B/D 0.22/1.65 | [13] | 56:22:11:9:2 | 98,300 |
| A-6 | a-4 | B 0.50 | [3] | 66:30:4 | 89,600 |
| A-7 | a-5 | C 0.21 | [14] | 67:22:10:1 | 42,700 |
| A-8 | a-6 | B/D 0.18/1.99 | [15] | 42:31:12:14:1 | 37,500 |
| A-9 | a-1 | D 2.46 | ** | 54:32:14 | 12,800 |

EXAMPLES 1–10; COMPARATIVE EXAMPLES 1–2

(Preparation and evaluation of photosensitive composition)

The various materials set forth in Table 3 below were each added to PGMEA (propylene glycol monoethyl ether acetate) in an amount adjusted such that the predetermined solid content was provided. The solution was then filtered through a filter having a pore diameter of 0.2 μm to prepare a resist solution (The concentration of the polymer solution was adjusted such that the total amount of PGMEA was 8 g).

The resist solution was applied to a silicon wafer by means of a spin coater, and then dried at a temperature of 130° C. for 60 seconds over a vacuum-adsorption type hot plate to obtain a resist layer having a thickness of 0.75 μm.

TABLE 3

Examples and comparative examples

| Example No. | Resin | Photo acid generator | Organic basic compound |
|---|---|---|---|
| Example 1 | A-1 (1.6 g) | B-1 (0.08 g) | C-1 (0.005 g) |
| Example 2 | A-2 (1.8 g) | B-1 (0.08 g) | C-2 (0.004 g) |
| Example 3 | A-3 (1.6 g) | B-1 (0.04 g)/B-2 (0.04 g) | C-2 (0.004 g) |
| Example 4 | A-4 (1.6 g) | B-2 (0.10 g) | — |
| Example 5 | A-5 (1.7 g) | B-1 (0.08 g) | — |
| Example 6 | A-6 (2.0 g) | B-1 (0.04 g)/B-2 (0.04 g) | C-1 (0.003 g) |
| Example 7 | A-7 (1.4 g) | B-1 (0.08 g) | C-2 (0.003 g) |
| Example 8 | A-8 (1.6 g) | B-2 (0.08 g) | — |
| Example 9 | A-2 (1.6 g) | B-1 (0.08 g) | C-2 (0.005 g) |
| Example 10 | A-8 (1.5 g) | B-1 (0.07 g) | C-2 (0.005 g) |
| Comparative Example 1 | A-9 (1.6 g) | B-1 (0.08 g) | C-1 (0.005 g) |
| Comparative Example 2 | A-9 (1.8 g) | B-1 (0.04 g)/B-2 (0.04 g) | C-2 (0.003 g) |

The various photo acid generators and organic basic compounds used in the foregoing examples will be described below.

(B-1)

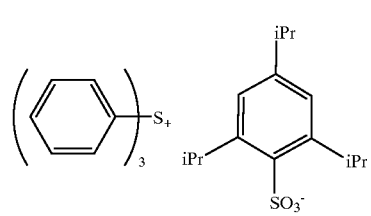

(B-2)

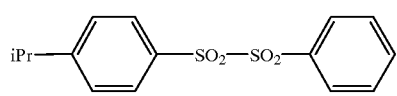

wherein iPr represents an isopropyl group.

(C-1)

(C-2)

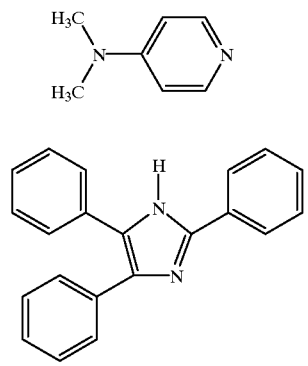

The resist layer thus prepared was then exposed to light by means of a 248 nm KrF exima laser stepper (NA=0.53). The resist layer thus exposed was then heated to a temperature of 130° C. over a hot plate for 60 seconds. The resist layer was immediately dipped in a 0.26 N aqueous solution of tetramethylammonium hydroxide (TMAH) for 60 seconds, rinsed with water for 30 seconds, and then dried. The resulting pattern on the silicon wafer was then observed under a scanning electron microscope to evaluate the properties of the resist. The results are set forth in Table 4.

TABLE 4

Results of evaluation of resist

| Example No. | Threshold resolution | Loss of lone pattern | Scum |
|---|---|---|---|
| Example 1 | 0.18 | 96 | ○ |
| Example 2 | 0.18 | 100 | ○ |
| Example 3 | 0.17 | 98 | ○ |
| Example 4 | 0.165 | 90 | ○ |
| Example 5 | 0.165 | 99 | ○ |
| Example 6 | 0.18 | 100 | ○ |
| Example 7 | 0.165 | 100 | ○ |
| Example 8 | 0.165 | 90 | ○ |
| Example 9 | 0.18 | 100 | ○ |
| Example 10 | 0.165 | 100 | ○ |
| Comparative Example 1 | 0.25 | 12 | X |
| Comparative Example 2 | 0.25 | 15 | X |

The resolution is represented by the threshold resolution at the exposure where a 0.30 μm line-and-space mask pattern is reproduced. The loss of lone pattern is represented by the percentage of minimum pattern left in contact with the substrate when the foregoing exposure is given. For the evaluation of scum, the amount of development residue on 0.50 μm resist pattern was determined in the following three-step criterion. In some detail, ○ indicates that no residues are observed, Δ indicates that some residues are observed, and X indicates that a considerable amount of residue is observed.

As can be seen in the results of Table 4 that all the positive-working photoresist compositions of the various examples according to the present invention gave satisfactory results while the positive-working photoresist compositions of the various comparative examples leave something to be desired in resolution, loss of lone pattern and scum. Further, the change in the viscosity of the resist solutions according to the present invention was traced. As a result, none of these resist solutions showed viscosity change with time at room temperature for 3 months.

Moreover, the resist patterns obtained from the positive-working photoresist compositions of Examples 2, 5, 8, 9 and 10 had no standing waves on the side wall thereof and thus gave satisfactory results.

As mentioned above, the present invention can provide an excellent chemically-sensitized positive-working photoresist composition which exhibits a high resolution and is less liable to loss of lone pattern. The present invention further provides an excellent chemically-sensitized positive-working photoresist composition which exhibits an excellent developability (which generates no development residue (scum)) and less standing waves. The positive-working photoresist composition of the present invention exhibits a reduced change in viscosity with time and thus can provide a stable photoresist composition.

While the invention has been described in detail and with reference to specific embodiments thereof, it will be apparent to one skilled in the art that various changes and modifications can be made therein without departing from the spirit and scope thereof.

What is claimed is:

1. A positive-working photoresist composition comprising at least (a) a copolymer A having at least structural units represented by the following general formulae (I), (II) and (III), (b) a compound which generates an acid when irradiated with actinic rays or radiation and (c) a solvent:

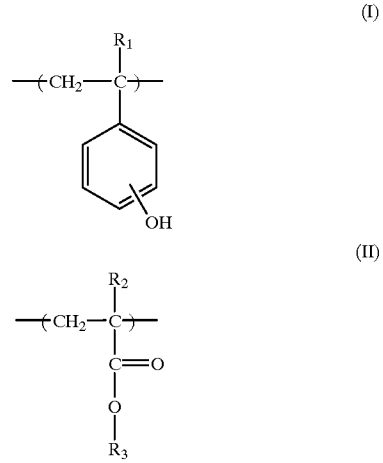

(III)

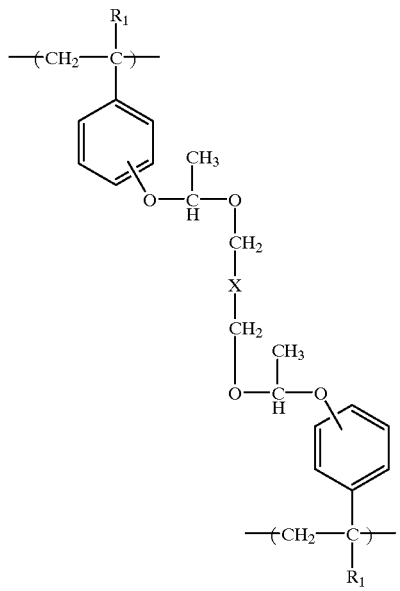

wherein $R_1$ and $R_2$ each independently represent a hydrogen atom or a methyl group; $R_3$ represents a tertiary alkyl group or a tertiary cycloalkyl group which may be substituted; and X represents a divalent organic residue.

2. The positive-working photoresist composition according to claim 1, wherein said copolymer A as the component (a) further contains a structural unit represented by the following general formula (IV):

(IV)

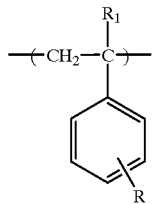

wherein $R_1$ represents a hydrogen atom or a methyl group; and R represents a hydrogen atom, a straight-chain or branched alkyl group having 1 to 4 carbon atoms, a methoxy group or an acetoxy group.

3. The positive-working photoresist composition according to claim 1, wherein said copolymer A as the component (a) further contains a structural unit represented by the following general formula (V):

(V)

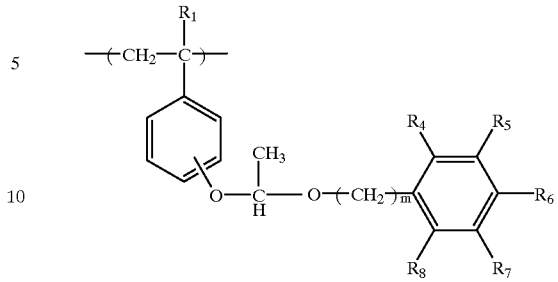

wherein $R_1$ represents a hydrogen atom or a methyl group; $R_4$ to $R_8$ each independently represent a hydrogen atom, a hydroxyl group, a straight-chain, branched or cyclic alkyl group having 1 to 8 carbon atoms, an alkoxy group having 1 to 4 carbon atoms or a halogen atom; and m represents an integer of from 1 to 6.

4. The positive-working photoresist composition according to claim 1, wherein said copolymer A as the component (a) is one obtained by the reaction of a copolymer having the structural units represented by the general formulae (I) and (II) with a divinyl ether compound represented by the following general formula (VI):

(VI)

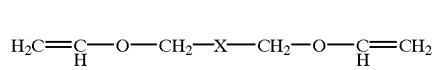

wherein X represents a divalent organic residue.

5. The positive-working photoresist composition according to claim 4, wherein X in the foregoing general formula (VI) is a group selected f from the group consisting of the f following divalent organic residues:

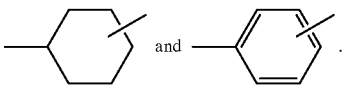

6. The positive-working photoresist composition according to claim 1, wherein said compound (b) which generates an acid when irradiated with actinic rays or radiation contains at least one sulfonium salt represented by the following general formula (VII):

(VII)

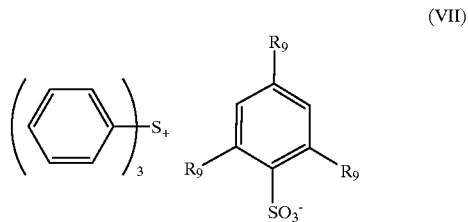

wherein $R_9$'s each independently represent a hydrogen atom or a branched alkyl group having 3 to 16 carbon atoms, with the proviso that at least one of $R_9$'s is not a hydrogen atom.

* * * * *